United States Patent [19]

Mortimer

[11] Patent Number: 4,599,722
[45] Date of Patent: Jul. 8, 1986

[54] APPARATUS FOR ENCODING AND DECODING DIGITAL DATA TO PERMIT ERROR CORRECTION

[75] Inventor: Brian C. Mortimer, Ottawa, Canada

[73] Assignee: Canadian Patents and Development Limited-Société Canadienne des Brevets et D'Exploitation Limitée, Ottawa, Canada

[21] Appl. No.: 596,397

[22] Filed: Apr. 3, 1984

[51] Int. Cl.$^4$ ............................................. G06F 11/10
[52] U.S. Cl. ....................................... 371/37; 371/39
[58] Field of Search ............................ 371/37, 39, 40; 364/200, 900

[56] References Cited

U.S. PATENT DOCUMENTS

| | | | |
|---|---|---|---|
| 4,358,848 | 11/1982 | Patel | 371/39 |
| 4,414,666 | 11/1983 | Nelson | 371/39 |
| 4,447,902 | 5/1984 | Wilkinson | 371/37 |
| 4,498,178 | 2/1985 | Ohhashi | 371/37 |
| 4,507,782 | 3/1985 | Kunimasa | 371/37 |
| 4,527,269 | 7/1985 | Wood et al. | 371/37 |
| 4,536,878 | 8/1985 | Rattlingourd | 371/37 |

Primary Examiner—Michael R. Fleming

[57] ABSTRACT

Apparatus to permit the correction of a single bit error occurring in a sequence of data packets (e.g. bytes) comprising data bits. An encoder produces an error correction packet (e.g. byte), the value of which is determined algebraically from the value of bits in the data sequence. All data packets and the error correction packet have a predetermined parity. A decoder receives the sequence of data packets and error correction packet. If a single bit error in the data bits has occurred during transmission, one data packet is identified as having in it the bit in error. Algebraically, the data bit in error is identified and corrected.

30 Claims, 11 Drawing Figures

TABLE OF ELEMENTS OF THE GALOIS FIELD GF($2^7$)
7 BIT REPRESENTATION OF FIELD ELEMENTS

| FIELD ELEMENT | $a^0$ | $a^1$ | $a^2$ | $a^3$ | $a^4$ | $a^5$ | $a^6$ |
|---|---|---|---|---|---|---|---|
| $a^0$ | 1 | 0 | 0 | 0 | 0 | 0 | 0 |
| $a^1$ | 0 | 1 | 0 | 0 | 0 | 0 | 0 |
| $a^2$ | 0 | 0 | 1 | 0 | 0 | 0 | 0 |
| $a^3$ | 0 | 0 | 0 | 1 | 0 | 0 | 0 |
| $a^4$ | 0 | 0 | 0 | 0 | 1 | 0 | 0 |
| $a^5$ | 0 | 0 | 0 | 0 | 0 | 1 | 0 |
| $a^6$ | 0 | 0 | 0 | 0 | 0 | 0 | 1 |
| $a^7$ | 1 | 0 | 0 | 1 | 0 | 0 | 0 |
| $a^8$ | 0 | 1 | 0 | 0 | 1 | 0 | 0 |
| $a^9$ | 0 | 0 | 1 | 0 | 0 | 1 | 0 |
| $a^{10}$ | 0 | 0 | 0 | 1 | 0 | 0 | 1 |
| $a^{11}$ | 1 | 0 | 0 | 1 | 1 | 0 | 0 |
| $a^{12}$ | 0 | 1 | 0 | 0 | 1 | 1 | 0 |
| $a^{13}$ | 0 | 0 | 1 | 0 | 0 | 1 | 1 |
| $a^{14}$ | 1 | 0 | 0 | 0 | 0 | 0 | 1 |
| $a^{15}$ | 1 | 1 | 0 | 1 | 0 | 0 | 0 |
| $a^{16}$ | 0 | 1 | 1 | 0 | 1 | 0 | 0 |
| ⋮ | ⋮ | ⋮ | ⋮ | ⋮ | ⋮ | ⋮ | ⋮ |
| $a^{125}$ | . | . | . | . | . | . | . |
| $a^{126}$ | . | . | . | . | . | . | . |

NOTE: $a^{127}=1$, SINCE THE FIELD IS CYCLIC AND HAS 128 ELEMENTS. ie $0, a^0 \ldots a^{126}$ A FEEDBACK SHIFT REGISTER WHICH GENERATES NON-ZERO ELEMENTS OF THE GALOIS FIELD GF($2^7$) BY SUCCESSIVE MULTIPLICATION OF THE CONTENTS THEREOF BY $a$ TABLE OF ELEMENTS OF THE GALOIS FIELD GF($2^7$)
7 BIT REPRESENTATION OF FIELD ELEMENTS

| FIELD ELEMENT | $a^0$ | $a^1$ | $a^2$ | $a^3$ | $a^4$ | $a^5$ | $a^6$ |
|---|---|---|---|---|---|---|---|
| $a^0$ | 1 | 0 | 0 | 0 | 0 | 0 | 0 |
| $a^1$ | 0 | 1 | 0 | 0 | 0 | 0 | 0 |
| $a^2$ | 0 | 0 | 1 | 0 | 0 | 0 | 0 |
| $a^3$ | 0 | 0 | 0 | 1 | 0 | 0 | 0 |
| $a^4$ | 0 | 0 | 0 | 0 | 1 | 0 | 0 |
| $a^5$ | 0 | 0 | 0 | 0 | 0 | 1 | 0 |
| $a^6$ | 0 | 0 | 0 | 0 | 0 | 0 | 1 |
| $a^7$ | 1 | 0 | 0 | 1 | 0 | 0 | 0 |
| $a^8$ | 0 | 1 | 0 | 0 | 1 | 0 | 0 |
| $a^9$ | 0 | 0 | 1 | 0 | 0 | 1 | 0 |
| $a^{10}$ | 0 | 0 | 0 | 1 | 0 | 0 | 1 |
| $a^{11}$ | 1 | 0 | 0 | 1 | 1 | 0 | 0 |
| $a^{12}$ | 0 | 1 | 0 | 0 | 1 | 1 | 0 |
| $a^{13}$ | 0 | 0 | 1 | 0 | 0 | 1 | 1 |
| $a^{14}$ | 1 | 0 | 0 | 0 | 0 | 0 | 1 |
| $a^{15}$ | 1 | 1 | 0 | 1 | 0 | 0 | 0 |
| $a^{16}$ | 0 | 1 | 1 | 0 | 1 | 0 | 0 |
| ⋮ | ⋮ | ⋮ | ⋮ | ⋮ | ⋮ | ⋮ | ⋮ |
| $a^{125}$ | ⋮ | ⋮ | ⋮ | ⋮ | ⋮ | ⋮ | ⋮ |
| $a^{126}$ | • | • | • | • | • | • | • |

NOTE: $a^{127}=1$, SINCE THE FIELD IS CYCLIC AND HAS 128 ELEMENTS. ie $0, a^0 \ldots a^{126}$

FIG. 1

A FEEDBACK SHIFT REGISTER WHICH GENERATES NON-ZERO ELEMENTS OF THE GALOIS FIELD GF($2^7$) BY SUCCESSIVE MULTIPLICATION OF THE CONTENTS THEREOF BY $a$

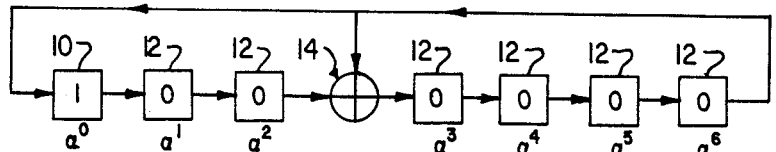

IF INITIALLY LOADED WITH 1000000 THE ABOVE REGISTER WILL GENERATE SUBSEQUENT REPRESENTATIONS OF $a^x$ (FOR $a^0 - a^{126}$) UPON EACH SHIFT OF THE REGISTER (FROM LEFT TO RIGHT). THEREFORE, AFTER 126 SHIFTS ALL NON-ZERO FIELD ELEMENTS WILL HAVE BEEN REPRESENTED IN THE REGISTER.

FIG. 2

BLOCK DIAGRAM OF ENCODING/DECODING SYSTEM, USING THE CARLETON CODE.

BLOCK DIAGRAM OF A PROCESS TO ENCODE A BLOCK OF DATA BYTES ACCORDING TO THE CARLETON CODE.

FLOWCHART OF PROCESS FOR ENCODING 27 DATA BYTES ACCORDING TO THE CARLETON CODE

LOGIC CIRCUITRY TO ENCODE A DATA BLOCK WITH 1 PARITY BIT PER BYTE AND A 1 BYTE CARLETON CODEWORD.

FIG. 9 LOGIC CIRCUITRY TO DECODE A DATA BLOCK HAVING ONE CARLETON CODE ERROR CORRECTION BYTE.

FLOW CHART OF METHOD FOR DECODING
28 BYTES CONTAINING ONE BYTE BEING
A CARLETON CODE BYTE.

APPARATUS FOR ENCODING AND DECODING DIGITAL DATA TO PERMIT ERROR CORRECTION

FIELD OF THE INVENTION

This invention relates to apparatus for correcting a single bit (i.e. binary digit) error occurring in a block of data, consisting of a sequence of binary digits.

BACKGROUND OF THE INVENTION

In digital data communication systems, a sequence of bits (i.e. a signal comprising binary digits) originates from a transmitter and is transmitted through a communications channel to a receiver. If the communication channel were perfect, the sequence of bits received at the receiver would be identical to the transmitted data bits. However, communications channels are not perfect and, because of the presence of noise and other spurious signals, the received data may very well not be the same as the transmitted data. Accordingly, systems have been designed to detect and correct errors occurring in sequences of received data. Such systems determine if some of the bits of the received data differ from the transmitted data, and thereafter correct the error or errors. The coding system disclosed herein permits the detection and correction of a single error occurring in a block (i.e. sequence) of bits.

A bit error occurring in a block of received digital data in data communication systems such as the videotex information system known, in Canada, as Telidon* (*an official mark of the Government of Canada, Ministry of Communications, for which notice has been given under Section 9(1) (n) (iii) of the *Canadian Trade Marks Act*) often results in noticeable and unacceptable picture distortion which, in turn, necessitates requesting, at the receiver, retransmission of that data block and waiting for some time interval before the retransmitted data block is received. Both picture distortion and retransmission delays are undesirable and may contribute to user/subscriber dissatisfaction with the data system. Consequently, it is desirable to be able to detect a bit error occurring in a block of received data bits and to correct the error within the receiver. Such error correction capability allows the correction of a bit error occurring in a block of data before the error results in picture distortion and eliminates having to wait for reception of the retransmitted data block.

Several single bit error correction methods are known, and many different apparatuses for encoding and decoding data blocks to permit the correction of a single bit error have been developed. For example, a group of data packets (e.g. bytes) may be horizontally and vertically parity encoded (i.e. non-algebraically encoded), denoted herein as the "Product Code", by using one parity bit in each byte and one code byte for each block of data bytes. To encode a block of data bytes using the Product Code one parity bit is appended to each group of 7 data bits to form parity encoded bytes. Then a byte (consisting of 8 bits), referred to as the Product Code byte, is determined and inserted in the data block. Each bit (e.g. the 3rd bit) of the Product Code byte is determined from the corresponding bits (e.g. the 3rd bits) in each of the data bytes and is set to either "0" or "1" according to the selected parity, i.e. the desired parity of those bits, taken as a group. The Product Code is a well known data encoding method. For a more detailed description of this coding method, reference should be made to information theory or coding textbooks, or both.

Another example of a single error correction method is known as the SAB code developed by G. E. Séguin, P. E. Allard and V. K. Bhargava and described in *A Class of High Rate Codes for Byte-Oriented Information Systems*, I.E.E.E. Transactions on Communications, Vol. COM-31, No. 3, March 1983.

Two disadvantages of the single bit error correction methods known heretofore, and equipment developed to implement those methods, are (i) the range of the number of data bits which can be encoded, and therefore corrected, by them, is narrow and (ii) some have a relatively high probability of making a decoding error or decoding failure when the communications channel transmitting the data includes white Gaussian noise and/or short noise bursts. (A "decoding error" may be defined as occurring when a bit correction is performed when the bit was correct or when a bit error is not corrected in the mistaken belief that no error occurred. A "decoding failure" may be defined as occurring when one or more errors are known to exist but where the erroneous bit(s) cannot be identified.) Consequently, it is desirable to develop a coding technique which can encode a wide range of numbers of data bits and which performs satisfactorily in the presence of either white Gaussian noise or short noise bursts.

SUMMARY OF THE INVENTION

A data encoding and decoding system, suitable for use in a videotex information system, has been developed whereby one packet (comprising bits) is provided for each block of data packets as redundant data and each packet (including the redundant packet) is provided with one parity bit. This coding method has been named the "Carleton Code" by the inventor. The bits of the redundant data packet are determined algebraically from the data packets comprising the data block. The Carleton Code enables the correction of a single bit error occurring in a block of data. (A word of caution is in order. The term "packet" is used in this application in a special sense and does not mean a 33 byte packet as in Telidon* nomenclature. In this regard reference should be made to the following definitions.)

Definitions:

Before providing a summary of the invention, it will be helpful, to ensure consistency, to define some of the terminology employed in the disclosure and claims.

1. A "bit" is a binary digit and has one or other of two values. For example, a bit may be either 0 or 1.
2. A "data packet", or "packet", is a sequence of a fixed number of bits. The well known term "byte" is a packet having 8 bits. Equally, (with some appropriate modification of the method and apparatuses herein disclosed) a packet could be selected having 5, 9, 16 or 87 bits, for example.
3. A data block is a sequence of a fixed number of packets.
4. A parity check bit is an extra bit at a predetermined location in a sequence of bits and is used for error detection purposes. Suppose that a data packet includes 7 data bits. To those 7 data bits a parity check bit might be appended such that the value of the parity bit depends on the number of data bits which are a "1". As an example, if it is desired that all data packets have an even number of 1's (i.e. "even parity"), the parity check bit is set as a "0" or "1" depending on the number of 1's in the packet. The parity check bit is "0" if there are an even number of 1's in the packet and "1" if there are an odd number of 1's in the packet so that the total number of 1's in the resulting data packet is an even number. Thus, the resulting data packet is referred to as an "even parity encoded data byte". Through the opposite parity bit selection process, 7 data bits might alternatively be incorporated into an 8 bit data packet having odd parity, referred to as an "odd parity encoded data byte". The presence of a parity check bit permits the identification of a byte with a single bit error but does not in itself permit the identification of the specific bit which is in error.

The present invention provides an encoding apparatus and method for subsequent correction of a single bit error occurring in a data block. An error correction packet is produced for transmission in the data block. The data block consists of an error correction packet and $(L-1)$ data packets, each packet having M bits and the same predetermined parity, one bit of each of the packets being a parity check bit. The symbol $C_i$ is considered to represent the binary value of the ith bit in the data block such that the bit sequence $(C_0, C_1, C_2, \ldots C_N)$ represents the binary values of the sequence of bits in the data block of length $(N+1)$ bits, whereby $N+1=ML$. The bit sequence $(C_{jM}, C_{jM+1}, C_{jM+2}, \ldots C_{jM+(M-1)})$ is considered to represent the values of each of the M bits of the error correction packet (the error correction packet being the $(j+1)$st packet of the data block. The symbol $\alpha$ is considered to represent a primitive element of a Galois Field $GF(2^{M-1})$, $\alpha$ being a root of a primitive polynominal $Q(X)$ of degree $(M-1)$. The arithmetic operation addition is performed according to modulo 2 arithmetic.

The single bit error correction encoding apparatus comprises the following:
(a) Evaluation means for evaluating the sum T having an expansion as a pattern of $(M-1)$ bits, whereby $$T = \sum_{i=0}^{jM-1} C_i \alpha^i + \sum_{i=jM+M}^{N} C_i \alpha^i,$$

if j is not equal to 0 or $(L-1)$ or, $$T = \sum_{i=M}^{N} C_i \alpha^i,$$

if j is equal to 0, or, $$T = \sum_{i=0}^{(L-1)M-1} C_i \alpha^i,$$

if j is equal to $L-1$; and,
(b) Selection means for selecting the error correction packet such that:
  (i) the selection means produces a sequence of bits $(C_{jM}, C_{jM+1}, \ldots$ the relationship expressed as:

$$\sum_{i=jM}^{jM+(M-1)} C_i \alpha^i = T,$$

whereby T is the sum of said evaluation means; and,
  (ii) the sequence of bits $(C_{jM}, C_{jM+1}, \ldots C_{jM+(M-1)})$ has the same predetermined parity as that of each of the data packets of said data block.

The present invention further provides a decoding aparatus and method for the correction of a single bit error occurring in a data block comprising $(L-1)$ data packets and one error correction packet, the data block having been previously encoded in accordance with the above. That is, each packet of the data block having been encoded to have M bits and the same predetermined parity and an error correction packet having been produced and inserted to the data block such that the value of the sum represented by $$\sum_{i=0}^{N} C_i \alpha^i$$

equaled zero.

The single bit error correction decoding apparatus comprises the following:
(a) parity error identification means for identifying any one of the packets not having the predetermined parity;
(b) evaluation means for evaluating the sum R whereby $$R = \sum_{i=0}^{N} r_i \alpha^i,$$

the symbol $r_i$ representing the binary value of the ith bit of the received data block such that the bit sequence $(r_0, r_1, r_2, \ldots r_N)$ is considered to represent the binary values of the received sequence of bits of the data block; and
(c) bit correction means for correcting an incorrect bit in the received data block the correcting means comprising means to identify and change bit $r_g$ in the $(k+1)$st packet of the received data block wherein the value g is determined from the sum R of the evaluation means according to the relationship $R=\alpha^g$ such that $MK \leq g \leq (MK+M-1)$, K being an integer greater than or equal to 0 and less than or equal to $(L-1)$, the $(K+1)$st packet having been identified by the parity error identification means as having other than the predetermined parity.

In the preferred embodiments of the above apparatus the values of "L", "M", "N", and "j" are selected to be 28, 8, 223 and 0, respectively and the polynomial $Q(X)$ is the polynomial $X^7+X^3+1$. The evaluation means and/or selection means and/or bit correction means may include a 7-bit feedback shift register. Alternatively, the evaluation means and/or selection means and/or bit correction means may include a microprocessor and memory accessible thereto.

The advantage of the present invention, which utilizes the Carleton Code, is that it allows a wide range of lengths of data bits to be encoded so as to permit the correction of a single bit error occurring in the dta bits upon transmission, while still performing acceptably when the data bits have been subjected to white Gaussion noise or noise bursts. The invention utilizes both a parity check bit per data packet and an algebraically determined check packet.

BRIEF DESCRIPTION OF THE DRAWINGS

The invention will now be described, by way of example only, with reference to the following drawings in which:

FIG. 1 is a portion of a table of Galois field elements contained in the Galois Field $GF(2^7)$, or 128 elements. Arithmetic usiñg the field elements is performed modulo 2. Representations of some of the field elements (i.e. the first few) are provided in terms of the first seven elements of the field, the basis elements of the field, in FIG. 1.

FIG. 2 is a block diagram of a 7 bit feedback shift register capable of generating all non-zero elements of the Galois field $GF(2^7)$.

DESCRIPTION OF THE PREFERRED EMBODIMENT

In the following discussion, it is assumed that each data packet is a byte, consisting of eight bits and that a block of data consists of a sequence of twenty-eight bytes. Of the 28 bytes, 27 are data bytes and the 28th byte is selected according to the method described herein. The 28th byte may be called the Carleton Code error correction byte.

In each byte, there are seven data bits and one parity bit. The parity bit, present in every byte, is necessary in the disclosed embodiments of the present invention because the parity bit enables identification of the presence of an error in any received byte. As descibed hereafter, the error correction byte may result in the identification of more than one bit, in different bytes, which may contain an erroneous bit. Therefore it is necessary to be able to identify the byte having the error in order to be able to choose which one of the possible erroneous bits is the erroneous bit. Furthermore, it is preferable to be able to identify a situation where more than one byte is erroneous (i.e. where there is more than just a single bit error), and such capability is provided by a parity bit in each byte.

The 28th byte is specially selected, as described in the following pages, so as to permit the identification of a single bit error in a 28 byte block of parity encoded bytes. The 28th byte is the error correction byte.

Although it is not necessary that the error correction byte be transmitted as the first or last byte in the data block, it may be more convenient to do so, and may be necessary for use with the encoding or decoding equipment selected.

Likewise, the parity bit, of each byte, can be selected and fixed as any of bits of the byte. However, it is usually preferable for the parity check bit to be the last bit of a byte (i.e. the 8th bit of the byte).

To recapitulate, for the purpose only of explaining the invention, a 28 byte data block is considered. Each byte has 7 data bits and one parity check bit. Twenty-seven of the twenty-eight bytes contain data. One of the bytes, the error correction byte, is specially chosen so that, in conjunction with the parity bit in every byte, single bit errors in a data block can be detected and corrected. The invention is not limited to 8 bit data packets and 28 byte data blocks, notwithstanding the selection of these parameters for explanation of the invention.

Figure 3:
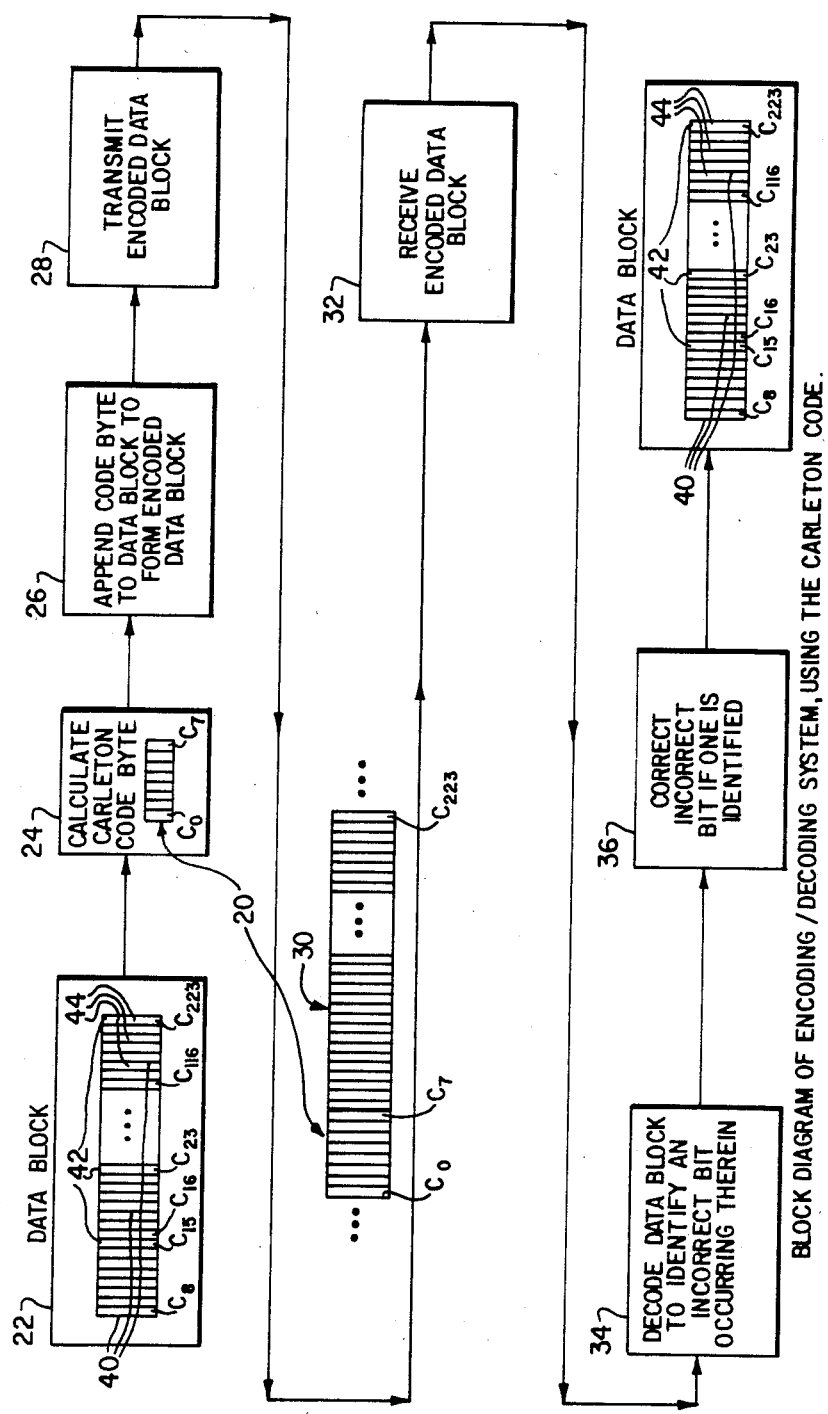
FIG. 3 is a block diagram of a system utilizing the Carleton Code to permit single bit error correction in a block of data.

To assist the reader in visualizing a data block, numeral 22 in FIG. 3 depicts a block of data and shows several bytes 40, each having eight bits 44 and a parity bit 42. Box 24 of FIG. 3 illustrates the error correction byte comprising bits denoted as $C_0$, $C_1$, $C_2$, $C_3$, $C_4$, $C_5$, $C_6$ and $C_7$. Box 30 shows a data block which includes a Carleton Code error correction byte (i.e. bits $C_0$ through to $C_7$).

The present invention provides algebraic means for encoding and decoding blocks of data to permit single bit error correction. The number of bits available for the code is fixed and is the same as the number of bits in a data packet hereinafter selected to be a byte (i.e. having 8 bits), to permit incorporation of the code into a standard videotex information system requiring a predetermined number of redundant error-correcting bits and data block structure. The standard adopted in Canada for videotex information systems is the North American Presentation Level Protocol Standard (NAPLPS).

If a one error byte correction is to be algebraically determined from a number of data bytes each byte having a fixed number of bits, (i.e. 8) and, therefore, a fixed maximum value, (i.e. the numerical range available from 8 bits), it is necessary to establish a one-to-one relationship between the data bytes and elements of a finite field. Otherwise, algebraic manipulation of the data bytes might result in numbers (and, therefore, codes) having a magnitude which is not capable of being represented by an 8 bit number. It is necessary to conduct the required algebra within a finite field to ensure that each algebraic computation performed on an element (which is correlated to a data byte) results in another element within that field capable of being represented by a fixed number of bits. To appreciate this the reader might consider that the sum of the two-digit decimal numbers, 43 and 57, equal to 100, results in a three-digit decimal number in the infinite field of decimal real numbers which cannot be represented as a two-digit decimal number.

It is well known in coding theory that Galois fields provide unique finite cyclic fields, having desirable algebraic properties, which can be usefully used to encode data algebraically. The following is a brief summary of the theory used in the present invention which utilizes a Galois field of 128 elements. $GF(2^7)$.

Comments on Galois Fields:

It can be shown that there is a finite Galois field of 128 elements, $GF(2^7)$, having elements capable of being represented as a sum of 7 basis elements and for which addition and multiplication can be defined. Each element can be represented by a sequence of seven symbols each of which symbols has only one of two values (e.g. 0 or 1). Arithmetic is performed modulo 2. (i.e. $1+0=0+1=1$ and $0+0=0=1+1$) In particular, there exists a finite field of 128 independent elements denoted as $0, \alpha^0, \alpha^1, \alpha^2, \ldots, \alpha^{126}$, where $\alpha$ is defined as a root of a primitive polynomial of degree 7, namely, $x^7+x^3+1$. Furthermore, because $\alpha$ is a root, $\alpha^7+\alpha^3+1=0$, and, $\alpha^7=\alpha^3+1$ since arithmetic is modulo 2 (i.e. $GF(2^7)$ over $GF(2)$ is chosen). Also, the field is cyclic i.e. $\alpha^{127}=1$. Every element of the field can be represented in terms of the first seven non-zero elements $\alpha^0, \alpha^1, \alpha^2, \ldots, \alpha^6$ (called basis elements).

Referring to FIG. 1 there is illustrated a partial table of field elements of $GF(2^7)$ and the correspondng (equivalent) representation of those elements by the first seven non-zero basis elements. For example, the entry in the table of FIG. 1 for $\alpha^{12}$ shows that the thirteenth (non-zero) element of $GF(2^7)$ is $\alpha^{12}$ which may be represented as $\alpha^1+\alpha^4+\alpha^5$ (i.e. $0 \cdot \alpha^0 + 1 \cdot \alpha^1 + 0 \cdot \alpha^2 + 0 \cdot \alpha^3 + 1 \cdot \alpha^4 + 1 \cdot \alpha^5 + 0 \cdot \alpha^6$). This may be shown as follows:

$$\begin{aligned} \alpha^{12} &= \alpha^7 \cdot \alpha^5 \\ &= (\alpha^3 + 1)\alpha^6 \text{ [Recall that } \alpha^7 = \alpha^3 + 1] \\ &= \alpha^8 + \alpha^5 \\ &= \alpha^7 \cdot \alpha + \alpha^5 \\ &= (\alpha^3 + 1)\alpha + \alpha^5 \\ &= \alpha^1 + \alpha^4 + \alpha^5 \end{aligned}$$

The sum $\alpha^1+\alpha^4+\alpha^5$ can be written as $0 \cdot \alpha^0 + 1 \cdot \alpha^1 + 0 \cdot \alpha^2 + 0 \cdot \alpha^3 + 1 \cdot \alpha^4 + 1 \cdot \alpha^5 + 0 \cdot \alpha^6$, which in turn can be represented by the coefficients of that polynomial. That is, $\alpha^{12}$ may be represented by the 7 bit number 0100110. Each of the bits is the value of the coefficient of the polynomial $\alpha^1+\alpha^4+\alpha^5$. The leftmost bit being the value of the coefficient of $\alpha^0$ and the rightmost bit being the coefficient of $\alpha^6$.

Referring to FIG. 2 there is illustrated a 7 bit feedback shift register which can be utilized to generate all of the 7 bit coefficient representations of the non-zero field elements of $GF(2^7)$ for the primitive polynomial $X^7+X^3+1$. To do so one loads the register initially with $\alpha^0$ (i.e. 1000000, where the 1 is placed in the least significant register element 10), as shown, and repetitively shifts the register one bit towards the most significant element (in this case to the right) to generate each successive field element. Each shift of the register has the effect of multiplying the contents thereof by $\alpha$. The appropriate configuration of binary adder(s) and register elements necessary to generate the elements of a given Galois Field is well known. The configuration illustrated in FIG. 2 is the appropriate shift register configuration to generate the coefficients of the 6th degree polynomial representations of elements of $GF(2^7)$, using modulo 2 arithmetic.

Because every field element can be represented as a polynomial of the sixth degree (i.e. as $Z_0\alpha^0+Z_1\alpha^1+Z_2\alpha^2+Z_3\alpha^3+Z_4\alpha^4+Z_5\alpha^5+Z_6\alpha^6$), and as the Galois Field is closed, any sum (or multiplication) of field elements is within the field and may be also represented as a sixth degree polynomial. Thus, the sum $$\sum_{i=0}^{n} q_i \alpha^i$$

requires only seven coefficients and is, at most, a sixth degree polynomial.

Further the polynomial $Z_0\alpha^0+Z_1\alpha^1+Z_2\alpha^2+Z_3\alpha^3+Z_4\alpha^4+Z_5\alpha^5+Z_6\alpha^6$ can be represented by the sequence of its coefficients as $(Z_0, Z_1, Z_2, Z_3, Z_4, Z_5, Z_6)$, it being appreciated that the coefficient is position 6 is the multiplier for $\alpha^6$, and so forth.

It is to be noted that the foregoing comments are specifically directed to the Galois Field $GF(2^7)$ defined by the primitive polynomial $X^7+X^3+1$. As a reference to many mathematics texts will show, Galois field theory is general, not specific. The above is merely an example for descriptive purposes, assuming the use of modulo 2 arithmetic (i.e. the Galois Field $GF(2^7)$ is selected over $GF(2)$).

Encoding - Introduction

Having described the properties of a Galois field, employing modulo 2 arithmetic, the selection of the error correction byte is next considered in a general fashion.

There are 224 bits in a 28 byte data block. ($8 \times 28 = 224$). Each byte has seven information bits and one parity check bit so that each byte has fixed parity, selected hereafter to be odd parity. Let $C_0$ denote the value of the first bit, $C_1$ the value of the second bit, and so forth. The bits of the data block can then be represented as the sequence $[C_0, C_1, C_2, \ldots C_{223}]$. Each $C_i$, of course, has one of two values (either 0 or 1).

If it is assumed that the error correction byte is the first byte then the first byte is the sequence $[C_0, \ldots C_7]$, and $C_7$ may be selected as the parity check bit of the error correction byte.

In the present invention, $[C_0, \ldots C_7]$ are selected so that the polynomial sum $$\sum_{i=0}^{223} C_i \alpha^i$$

equals zero, i.e. the sequence (0, 0, 0, 0, 0, 0, 0), and the bit sequence $C_0, \ldots C_7$ has the same parity as the data bytes. The sum may be represented by a seven bit sequence, each bit representing a coefficient of the polynomial sum.

As a modulo 2 arithmetic is employed, this means that:

$$\sum_{i=0}^{7} C_i \alpha^i = \sum_{i=8}^{223} C_i \alpha^i.$$

Restating this essential point, bits $C_8$ through to $C_{223}$ are fixed because they contain either data or a parity bit. But, bits $C_0$ to $C_7$ are open for selection and, for the reasons noted below, are chosen so that $$\sum_{i=0}^{223} C_i \alpha^i = 0$$

Decoding - Introduction

Suppose that a sequence of 224 bits, including parity bits and an error correction byte, is selected such that $$\sum_{i=0}^{223} C_i \alpha^i = 0$$

at the transmission of the block of 224 bits. Let $r_i$, for $0 \leq i \leq 223$, denote the received bits.

Decoding is a two step process.

First, the parity of each byte is examined. If a single bit error has occurred, the parity bit will reveal which of the 28 bytes contains the error. Thus, checking the parity of each byte will locate that byte which has a bit error, but not which bit of the byte was wrongly received. Denote the byte with the error as the jth byte.

Second, assuming a single bit error, it is known that $$\sum_{i=0}^{223} C_i \alpha^i = 0.$$

Also, it is known that the jth byte contains one error. This means that the error is in one of the bits $r_{8j}$, $r_{8j+1}$, $r_{8j+2}$, ... $r_{8j+7}$, where $0 \leq j \leq 27$. Therefore, $$\sum_{i=0}^{223} r_i \alpha^i$$

equals one of $\alpha^{8j}$, $\alpha^{8j+1}$, ... or $\alpha^{8j+7}$ because one $r_i$ is incorrect. By computing $$\sum_{i=0}^{223} r_i \alpha^i,$$

which, since only one byte (the jth byte) has a parity failure, must be one and only one of $\alpha^{8j}$, $\alpha^{8j+1}$ ... $\alpha^{8j+7}$, the exact location of the error may be determined, being one of $r_{8j}$, $r_{8j+1}$, ..., $r_{8j+7}$. Having located the single bit, which has an error, the error is corrected by changing a received 1 to 0, or a received 0 to 1.

With the completion of the broad overview of the techniques for selecting the error correction byte, a detailed examination of the method and apparatus for choosing the error correction byte follows.

Encoding

To give one example of a method of encoding data according to the present invention, the data bits may be denoted such that each data byte contains 7 information bits in the least significant 7 bits of the byte and 1 parity bit in the most significant bit of the byte. Odd parity is selected. Thus, if the first 7 data bits of the first byte are 1011011, the parity bit is 0, and the bits denoted $C_8$ to $C_{15}$, where $C_8=1$, $C_9=0$, $C_{10}=1$, $C_{11}=1$, $C_{12}=0$, $C_{13}=1$, $C_{14}=1$ and $C_{16}$ (the parity bit)=0.

The Carleton Code byte comprising bits $C_0$ to $C_7$ is selected, as discussed above, so that the following statements are true:

1. $$\sum_{i=0}^{223} C_i \alpha^i = 0$$

(where the elements $\alpha^i$ are the Galois field elements described above, in 7 bit form.)

2. The parity of the error correction code byte is the same as the parity selected for the data bytes. (i.e. for the example disclosed herein, odd parity). Consequently, since modulo 2 arithmetic is used the sum $$\sum_{i=0}^{7} C_i \alpha^i$$

is equal to the 7 bit sum $$\sum_{i=8}^{223} C_i \alpha^i.$$

Parity bit $C_7$ is required such that $$\sum_{i=0}^{223} C_i \alpha^i = 0$$

remains true. Accordingly, if odd parity is desired and the parity of $C_0$ to $C_6$ is odd then $C_7$ is selected as 0. However, if the parity of $C_0$ to $C_6$ is even $C_7$ cannot be selected simply as 1 without modifying $C_0$ to $C_6$ so that the sum $$\sum_{i=0}^{223} C_i \alpha^i$$

remains zero. An example will serve to illustrate this. In both cases, an odd parity code is desired.

Case I $$\left( \sum_{i=8}^{223} C_i \alpha^i \text{ has odd parity} \right)$$

Assume that $$\sum_{i=8}^{223} C_i \alpha^i$$

is represented as 1010100 (i.e. odd parity). $C_0$ to $C_7$ are required so that:

$$\sum_{i=0}^{223} C_i \alpha^i = 0 \quad (1)$$

and, (2) $C_7$ sets the parity of $C_0$ to $C_7$ to be odd. (i.e. an odd number of 1's).

If we select $C_0$ to $C_6$ as 1010100 and $C_7$ as 0 the requirements of (1) and (2) above are satisfied. This is so because $\alpha^0$ to $\alpha^6$ are just the individual bit sequences, 1000000 to 0000001, i.e. representing simply the bit position, and do not add any information to the bits $C_0$ to $C_6$. That is, $C_0 \alpha^0 = 1 \times 1000000 = \alpha^0$ if $c_0 = 1$. However, this is not so far $\alpha^7$ which is represented by 1001000 (i.e. none of $C_0$ to $C_6$). In the case of odd parity $C_0$ to $C_6$, $C_7$ can be set to 0 since the addition of a 0 does not result in any change to the desired sum $$\sum_{i=0}^{7} C_i \alpha^i,$$

or the parity of $C_0$ to $C_6$ (i.e. 1010100).

Case II $$\left( \sum_{i=8}^{223} C_i \alpha^i \text{ has even parity} \right)$$

Assume that $$\sum_{i=8}^{223} C_i \alpha^i$$

as represented by 1010101 (i.e. even parity). Again, $C_0$ to $C_7$ are required so that:

$$\sum_{i=0}^{223} C_i \alpha^i = 0 \quad (1)$$

and, (2) $C_7$ sets the parity of $C_0$ to $C_7$ to be odd. (i.e. an odd number of 1's).

If $C_0$ to $C_6$ were selected to be 1010101 (i.e. equal to the sum $$\sum_{i=8}^{223} C_i \alpha^i),$$

and $C_7$ selected to be 1 (i.e. to set the overall parity of $C_0$ to $C_7$ odd), the sum $$\sum_{i=0}^{7} C_i \alpha^i$$

would equal $\alpha^7$ i.e. represented as 1001000. Accordingly, since modulo 2 arithmetic applies, $\alpha^7$, 1001000, must be added on to $C_0 C_6$ if the required sum is to be zero. Therefore, instead of simply adding a 1 for $C_7$, 1001001 is added to the sum $$\sum_{i=8}^{223} C_i \alpha^i,$$

to produce the Carleton Code byte $C_0 \ldots C_7$. (It will be noted that $\alpha^7$ has even parity and therefore does not change the parity of $C_0$ to $C_6$.)

Conclusion of Case I and Case II (above):
The code byte (i.e. $C_0$ to $C_7$) may be selected as follows so that the code byte, in this example, has odd parity:
$C_0$ to $C_6$ are selected such that the sum $$\sum_{i=0}^{6} C_i \alpha^i \text{ equals the sum } \sum_{i=8}^{223} C_i \alpha^i \text{ and;}$$

(1) if the sum has odd parity, $C_7$ is selected to be 0.
or (2) if the sum has even parity, $C_7$ is selected to be 1 and 1001000 is added to $C_0$ to $C_6$.

Horner's Method:
There exists another useful form of the equation $$\sum_{i=0}^{223} C_i \alpha^i = 0$$

which can be used to manipulate data bytes rather than each data bit, $C_i$. It is also useful in that only one Galois field element is needed to determine the Carleton Code error correction byte. That Galois Field element is $\alpha^8$ (assuming that 8 bit data bytes are considered). If there are 27 data bytes and 1 error correction byte is desired the bytes can be denoted $B_{28}$ to $B_1$ corresponding to $C_0$ to $C_{223}$, described above. (i.e. $B_{28}$ corresponds to the sequence $[C_0, C_1 \ldots C_7]$ and $B_1$ corresponds to the sequence $[C_{216}$ to $C_{223}]$. The following demonstrates an alternative, algebrically determined form of the sum $$\sum_{i=0}^{223} C_i \alpha^i = 0$$

If the ith byte is $B_i = (b_{i,7}, b_{i,6}, \ldots, b_{i,0})$ then $$\sum_{i=1}^{28} \sum_{j=0}^{7} b_{i,j} \alpha^{(224-8i+j)} = 0$$

or, $(b_{1,7}\alpha^{223} + \ldots + b_{1,0}\alpha^{216}) + \ldots + (b_{28,7}\alpha^7 + \ldots b_{28,0}\alpha^0) = 0$ this can be rewritten as $(b_{1,7}\alpha^7 + b_{1,6}\alpha^6 + \ldots + b_{1,0}\alpha^0)\alpha^{8.27} +$ $(b_{2,7}\alpha^7 + b_{2,6}\alpha^6 + \ldots + b_{2,0}\alpha^0)\alpha^{8.26} + \ldots +$ $(b_{28,7}\alpha^7 + b_{28,6}\alpha^6 + \ldots + b_{28,0}\alpha^0)\alpha^{8.0} = 0$ Horner's method of determining polynomials may be used to determine the above. Also, similar to the case of summing each $C_i \alpha^i$, (previously described in detail) the code byte may be determined as follows:

$$\hat{B}_{28} = \hat{B}_1 (\alpha^8)^{27} + \hat{B}_2 (\alpha^8)^{26} + \ldots + \hat{B}_{27}(\alpha^8)^1 \quad (1)$$

$$\hat{B}_{28} = (\ldots (\hat{B}_1\alpha^8 + \hat{B}_2)\alpha^8 + \ldots + \hat{B}_{27})\alpha^8 \quad (2)$$

where, $\hat{B}_i = (b_{i,7}\alpha^7, \ldots, b_{i,0}\alpha^0)$

It will be noted that the representation of $B_i$ as an 8 bit number, is the same as the representation of $\hat{B}_i$, as an 8 bit number. That is, as an 8 bit number, $b_{i,7}$, if bit $b_{i,7}$ equals 1, is represented as 10000000, and, as an 8 bit number, $b_{i,7}\alpha^7$, if bit $b_{i,7}$ equals 1, is also represented as 10000000.

The correct parity of the code byte can be obtained by using the appropriate field element representation of $\alpha^8$, where required. That is $\alpha^8$ may be represented by $\alpha^4 + \alpha^1$ or $\alpha^7 + \alpha^4 + \alpha^3 + \alpha^1 + 1$, since $\alpha^7 + \alpha^3 + 1$ is equal to zero by definition.

This completes the discussion of encoding. Decoding is next considered in detail.

Decoding

Since the Carleton Code error correction byte $[C_0, \ldots C_7]$ has been selected so that the sum $$\sum_{i=0}^{223} C_i \alpha^i = 0,$$

and because every byte has a parity bit, we can identify any single bit error in a data block at the receiver following transmission of the data block, and therefore correct it, by evaluating the sum and, if non-zero, correlating that sum to the corresponding $\alpha^i$, i being the number of the erroneous bit. This is so because each bit, $C_0$ to $C_{223}$ has an $\alpha^i$ assigned to it. Thus if one bit, $C_i$, is incorrect its representation $\alpha^i$ will appear as the sum $$\sum_{i=0}^{223} C_i \alpha^i.$$

Recall that single errors only are corrected.

It will be noted that there is more than one bit assigned the element $\alpha^i$, namely $C_i$ and $C_{i+127}$, since there are more elements in the chosen data than Galois field elements in $GF(2^7)$. (That is, the data block chosen has 224 bits while the Galois field has only 127 non-zero elements.) Accordingly, if the sum $$\sum_{i=0}^{223} C_i \alpha^i$$

equals S (S being a 7 bit number and therefore necessarily equal to some $\alpha^i$), S may represent two bits. This indeterminance is eliminated by having each data byte parity encoded. That is, if there is only one bit error occurring in the data block there will be only one byte having incorrect parity. The incorrect bit may be identified as the bit which is represented by the 7 bit sum, S and which lies in a byte having incorrect parity. The process of decoding may be illustrated as follows.

Suppose that during transmisstion of the data block bit $C_{127}$ in byte $B_{12}$ is changed from a 0 to a 1 (due to noise in the communications channel for example). This means that $\alpha^{127} = \alpha^0$, and represented as 1000000, will be added to what otherwise summed to zero and the sum $$\sum_{i=0}^{223} C_i \alpha^i$$

will correspond to $\alpha^{127} = \alpha^0$.

Therefore the incorrect bit could be either of $C_0$ or $C_{127}$. If we check the parity of byte $B_{28}$ (containing $C_0$) and type $B_{12}$ (containing $C_{127}$) and find that only $B_{12}$ has a parity failure then bit $C_{127}$ is the erroneous bit and can be changed (i.e. corrected). (If both bytes show incorrect parity then a decoding failure has occurred and the bit errors cannot be connected by the present code. That is the condition that at the most a single bit error has occurred is not satisfied.)

A coding System utilizing the Carleton Code:

Referring to FIG. 3 there is illustrated, in block diagram form, the general steps involved in the process of encoding and decoding data using a Carleton Code error correction byte 20, chosen as described above.

The illustrated system involves a block 22 of data bytes 40, each byte 40 comprising eight bits 44 and each byte 40 having one parity bit 42 being the most significant bit in the byte. The Carleton Code error correction byte 20 is then calculated 24 for the data block 22 and appended to the data block 22 to form an encoded data block 26 having twenty-eight bytes. The encoded data block 30 is transmitted 28 and received 32. The data block is then decoded to identify a single bit error occurring therein 34. If identified, the incorrect bit is corrected 36 resulting in a received data block identical to transmitted data block 22.

Figure 4:
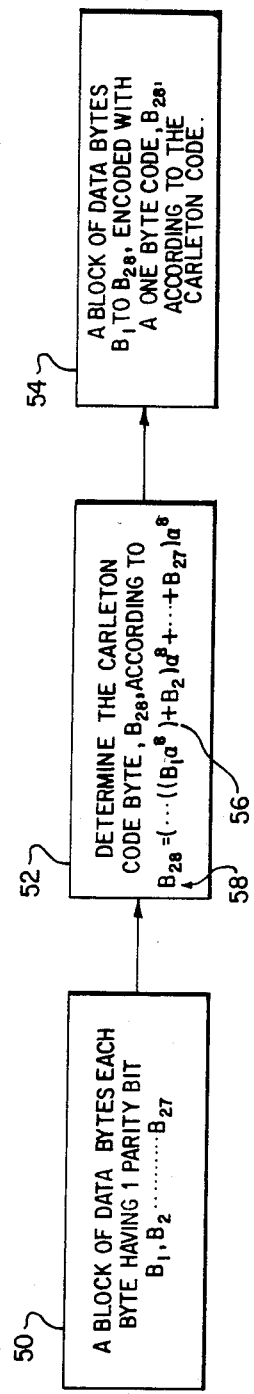
FIG. 4 is a block diagram of an apparatus for encoding a block of data according to the Carleton code.

The Encoder (i) An encoder which operates on data bytes successively:

Referring now to FIG. 4 there is illustrated, in block diagram form, a process to encode a block of data bytes to permit single bit error correction using a Carleton Code error correction byte. The process exemplified by FIG. 4 involves a block of data bytes 50, each data byte having a parity bit. The Carleton code error correction byte 58 (designated as $B_{28}$) is determined 56 according to Horner's method of evaluating the polynomial (2) above and the Carleton code error correctin byte 58 is then included with the block of data bytes 50 to form an encoded block of data 54.

Figure 5:
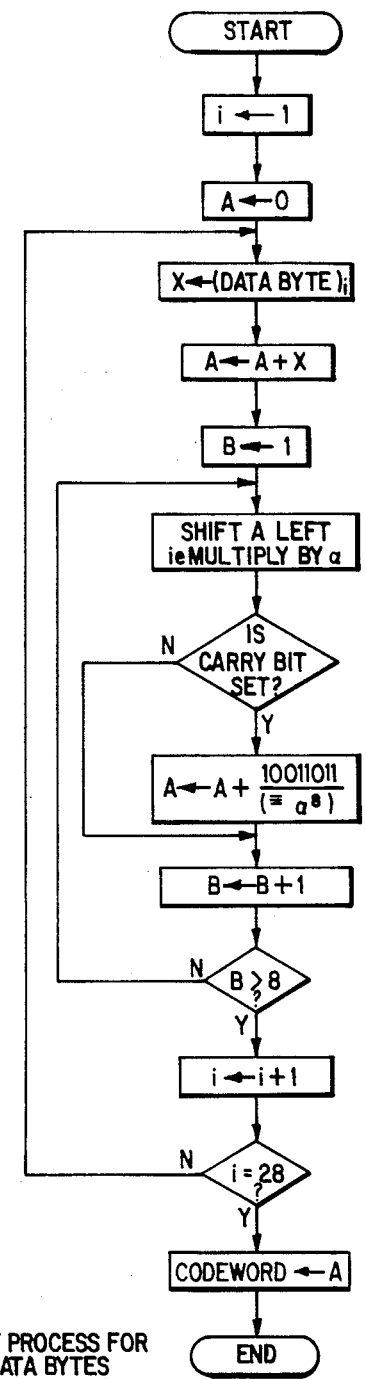
FIG. 5 is a flow chart illustrating, in more detailed form, the process of FIG. 4.

FIG. 5 illustrates a flow chart which identifies steps of a process which can be used with computation means, such as a microprocessor, to encode a block of data bytes to permit single bit error correction. This process utilizes the polynomial determination (2) above involving Horner's method. In the example illustrated by FIG. 5 the number of data bytes to be encoded is taken as 27 though it will be appreciated that a multitude of numbers of data bytes might be encoded satisfactorily according to this process.

The process of FIG. 5 begins with the step of setting two 8 bit registers. Register "i" is set to 1. Register "A" is set to 0. Next, register "X" is given the value of the ith data byte, that is, the value of $B_i$ (which initially would be $B_1$). Then register X, i.e. $B_i$, is added to register A and multiplied by $\alpha$ (the root of $GF(2^7)$, described above) eight times, successively. Multiplication by $\alpha$, using eight binary elements, may be efficiently accomplished by shifting, by one element, the binary elements towards the most significant element (in similar fashion to the generation of field elements by the feedback shift register illustrated in FIG. 2 and described above). If the most significant bit is a 1 (i.e. if register X contains the element $\alpha^7$ in its representation) the $\alpha$ multiplied by $\alpha^7$ results in $\alpha^8$ (equal to $\alpha^1 + \alpha^4$) which must be carried into the value of the product of register A and $\alpha$. To carry $\alpha^8$ (if present) $\alpha^8$ is added to the product by adding 0100100 to the product. Since the representation of $\alpha^8$ as $\alpha^1 + \alpha^4$ has even parity, the equivalent representation, $\alpha^0 + \alpha^1 + \alpha^3 + \alpha^4 + \alpha^7$, having odd parity, is added to the product. [Recall that $\alpha^7 + \alpha^3 + 1 = 0$.] This is because it is desired that the Carleton code byte have odd parity; however, the operations noted above would indeterminately change the parity of register A if an odd parity representation of $\alpha^8$ were not used. This is evident from the following: Register A begins with odd parity (i.e. 0) and 27 odd parity data bytes are added to register A, resulting in an odd parity number, but sometimes a 1 is shifted out of register A which will change its parity. Therefore, since $\alpha^8$ is always added to register A when a 1 gets shifted out of the register, the parity change due to the loss of the 1 may be effectively cancelled by rechanging the parity when $\alpha^8$ is added. Accordingly, odd parity $\alpha^8$ is added because an odd parity number added to another number (of odd or even parity) will always result in a number having the other parity.

Following multiplication by $\alpha$ eight times (i.e. multiplication by $\alpha^8$) the next data byte, the $(i+1)$th data byte, is added to register A and the steps of multiplying the value of register A by $\alpha^8$ are repeated. Then the above is repeated for all of the data bytes until all of the data bytes have been added to register A and multiplied by $\alpha^8$. The result, in register A, is the Carleton code error correction byte for the 27 data bytes. Appendix A illustrates a microprocessor program, written in assembly language for a MOTOROLA 6809 microprocessor, which substantially performs the steps of the flow chart of FIG. 5, to determine a Carleton code byte for a data block.

Figure 6:
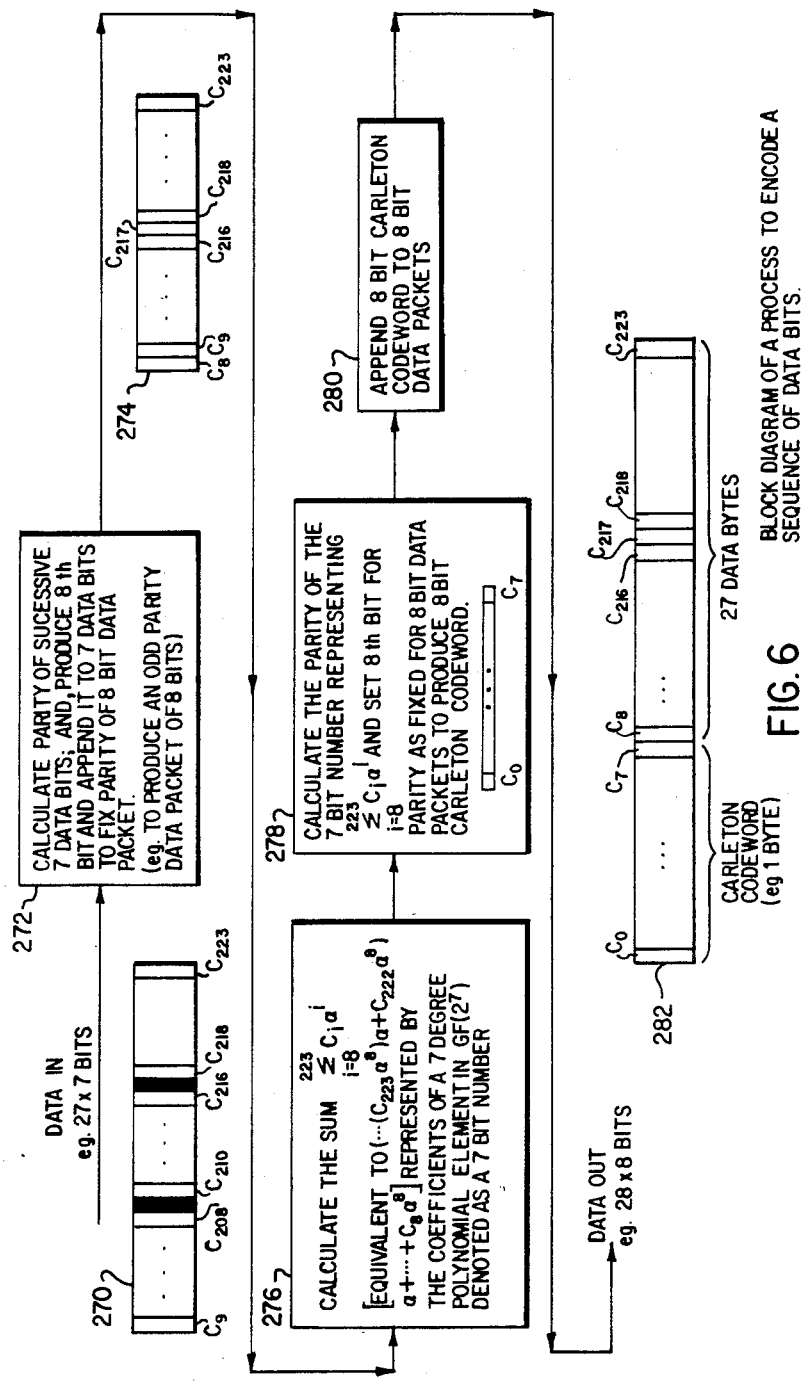
FIG. 6 is a block diagram of a process to encode a sequence of data bits with a parity bit per byte and a Carleton Code error correction byte.

(ii) An encoder which operates on data bits successively:

Referring now to FIG. 6 there is illustrated, in block diagram form, a process to encode a block of data bits to permit single bit error correction using a Carleton Code error correction byte. The process exemplified by FIG. 6 involves a block of data bits 270 consisting of $27 \times 7$ (i.e. 189) data bits; however, the process disclosed may be applied to other bit numbers (e.g. $23 \times 7$ data bits, $30 \times 7$ data bits etc.).

The data bits in the block of data bits 270 to be encoded are received serially. The number of "1" bits in each group of 7 received data bits is determined and the parity of the group of data bits is thereby identified 272. For example, if three "1" bits are present in the group of data bits, the group has odd parity. If two "1" bits are present in the group of data bits, the group has even parity. The parity of the group of 7 data bits is then set to the selected parity 272, for example, to odd parity, by producing an 8th bit and appending it to the group of 7 data bits. The 8th is either "1" or "0" depending upon the desired parity. For example, if odd parity is selected and the group of 7 data bits contains three "1" bits, the 8th parity bit appended to the group of 7 data bits is selected to be binary zero i.e. a "0" bit. If the group of 7 data bits contains two "1" bits, the 8th parity bit is selected to produce an odd number of "1"'s in the 8 bits (i.e. the 7 data bits plus the parity bit), and is therefore selected to be binary one i.e. a "1" bit. The resulting block of 27 8-bit bytes 274, each consisting of 7 data bits and 1 parity bit, is then encoded with a one byte Carleton codeword.

For convenience, individual bits of the 27 parity encoded bytes comprising data block 274 are denoted $C_{224}, C_{223}, \ldots C_8$, where $C_{217}, C_{209}, \ldots C_8$ are the parity bits and the remaining $C_i$'s (for $8 \leq i \leq 224$) are data bits.

As described in more detail above, to encode data bits $C_8$ through to $C_{223}$ with a one byte Carleton codeword, the sum $$\sum_{i=8}^{223} C_i \alpha^i$$

is calculated 276, to produce a 7th degree polynomial representation of the Galois field element of $GF(2^7)$, being equal to the sum, one bit representing each coefficient of the polynomial. The polynomial sum $$\sum_{i=8}^{223} C_i \alpha^i$$

is calculated using Horner's method of evaluating a polynomial 276. However, since the sum is "cutt-off" at $i=8$, each intermediate $C_i$ added to the partial product (produced using Horner's method of evaluating a polynomial) must be multiplied by $\alpha^8$ if the sum $$\sum_{i=8}^{223} C_i \alpha^i$$

is to be produced and not the sum $$\sum_{i=8}^{223} C_i \alpha^{(i-8)}.$$

To overcome this effect of the "cut-off" at $i=8$, the sum $$\sum_{i=8}^{223} C_i \alpha^i$$

is calculated according to the relationship ( . . . $(((C_{223}\alpha^8)\alpha + C_{223}\alpha^8)\alpha) + \ldots) \alpha + C_8\alpha^8$.

The Carleton codeword, consisting of one byte, denoted $C_0$ to $C_7$, is determined 278 from the polynomial sum $$\sum_{i=8}^{223} C_i \alpha^8,$$

represented by 7 bits, each bit corresponding to a coefficient of the polynomial. The Carleton codeword consists of the 7 bit representation of the sum $$\sum_{i=0}^{223} C_i \alpha^i,$$

parity encoded with an 8th bit (i.e. $C_7$) in such a manner that the sum $$\sum_{i=0}^{223} C_i \alpha^i$$

equal zero and the parity of the codeword is set to the selected parity of the data bytes. As explained above this is accomplished by selecting a "0" parity bit for the 8th bit if the parity of the 7 bit representation of $$\sum_{i=0}^{223} C_i \alpha^i$$

is odd or, if the 7 bit representation has even parity, by adding modulo 2 the 8 bit number 10010001 (i.e. $1 + \alpha^3 + \alpha^7$) to the 7 bit sum, to form the 8 bit codeword.

The 8 bit Carleton codeword is then appended to the block of parity encoded data bytes 280 to form a 28 byte block 282 encoded with a one byte Carleton codeword.

Figure 7:
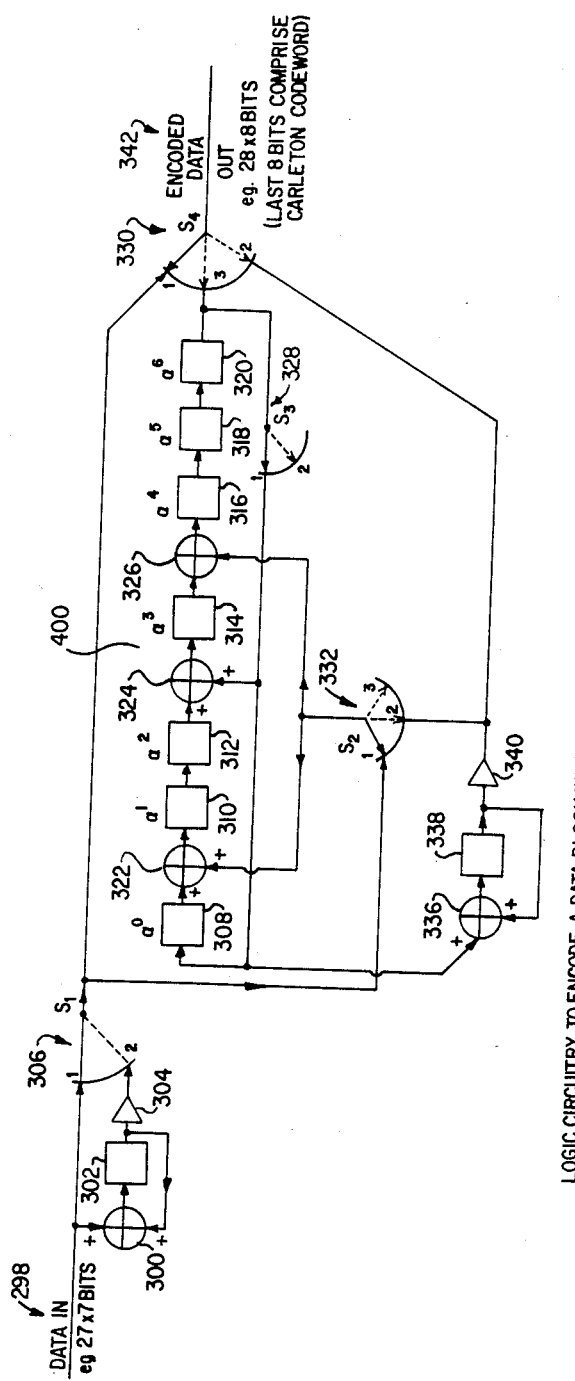
FIG. 7 is a schematic diagram of an apparatus for encoding a sequence of data bits with a parity bit per byte and a Carleton Code error correction byte.

Hardware Encoder:

Referring now to FIG. 7 there is shown a diagram of a circuit which receives a block of data bits to be encoded with one parity bit per seven data bits and following the receipt of a block of data bits, one Carleton codeword comprising 1 byte. It will be appreciated by the reader that the embodiment of FIG. 7 which implements, the present invention is specific and just one example of circuitry capable of implementing the present invention. A multitude of equivalent circuit components might be used to accomplish the task of one or more discrete circuit devices depicted in FIG. 7 without departing from the scope of the present invention. The circuitry illustrated in FIG. 7 and described below, is given by way of example only in recognition that variations thereof may be selected for different applications.

For the purpose of illustration and convenience, the number of data bits selected to be encoded by the logic circuit of FIG. 7 is $27 \times 7$ (i.e. 189) data bits. Following each group 298 of 7 data bits received a parity bit is produced and appended to the data bits to produce an 8th bit, being a parity bit, which sets the parity of the 8 bits to the selected parity. In the embodiment of FIG. 7, the parity selected is odd parity and therefore each group of 8 parity encoded data bits at the output 342 of the encoder has odd parity.

To encode each group of 7 received data bits 298 with one parity bit a switch 306 [$S_1$] is used together with circuitry which produces the appropriate parity bit for the group of 7 bits, the circuitry comprising binary adder 300, register 302 and inverter 304. Switch 306 remains in position 1 until 7 data bits have been received. (The counter controlling switch 306 is not shown). Initally register 302 is set to binary 0. As the 7 data are received, binary adder 300 adds the value of the received bit to the values of the previously received bits in the group of 7 bits. The received bits are successively added together using modulo 2 arithmetic and the sum is stored in register 302. When the 7th data bit has been received, register 302 holds the modulo 2 sum of the values of the 7 received data bits, which sum is inverted by inverter 304 to produce the appropriate parity bit to set the parity of the group of 7 data bits plus the parity bit to odd parity.

For example, if there were 3 "1" bits in the 7 data bits, register 302 would contain a "1" following the receipt of the 7th data bit and the output of inverter 304 would be "0", so that the group of 8 bits (i.e. 7 data bits plus 1 parity bit) have odd parity. Similarly, if there were 4 "1" bits in the 7 data bits, register 302 would contain a "0" following the receipt of the 7th data bit and the output of inverter 304 would be "1", so that the group of 8 bits (i.e. 7 data bits plus 1 parity bit) have odd parity. Switch 306 is switched to position 2 following the receipt of the 7th data bit so that the parity bit produced at the output of inverter 304 is received at switch 306 and is thereafter transmitted out of the encoder at switch 330, [S4]. Register 302 is then reset to zero and switch 306 reset to position 1 to receive the next 7 data bits in like manner and produce a second parity bit in like manner, and so on, until all data bits have been received and each group of 7 data bits has been encoded with a parity bit.

The feedback shift register 400, comprising registers 308, 310, 312, 314, 316, 318, and 320 and binary adders 322, 324, and 326, calculates the sum $$\sum_{i=8}^{223} C_i \alpha^i$$

for the parity encoded data bytes received at switch 306.

The feedback shift register cycles as each data bit or parity bit is received at switch 306 i.e. the value in each register 308, 310, 312, 314, 316, 318, 320 of the feedback shift register is shifted to the next register or (i.e. for register 320) is fed back into a preceeding register. It will be recalled from the above discussion that the configuration comprising register 308 to 320 and binary adder 324 is capable of generating successive elements of $GF(2^7)$ when cycled (see also FIG. 2). Binary adders 322 and 326 effect the addition of $C_i\alpha^8$ to the contents of the feedback shift register as each bit, $C_i$, being either a "1" or a "0", is received at switch 332, $S_2$. The continual addition of $C_i\alpha^8$ to the shift register together with the cycling of the shift register as each bit is received at switch 306, $S_1$, (which causes the contents thereof to be multiplied by $\alpha$) effects the computation $$\sum_{i=8}^{223} C_i \alpha^i,$$

calculated according to Horner's method of evaluating the sum, as discussed above with respect to FIG. 6.

Switch 330 [S4] is in position 1 until all data bits and parity bits for the data block 298 have been received at switch 306, $S_1$. Therefore, the data bits and parity bits received at switch 306, $S_1$, are transmitted as part of the encoded data 342 output, comprising 27 parity encoded data bytes, i.e. $C_{223}$ to $C_8$. (The Carleton code error correction byte will complete the encoded data output block.) Switch 328, $S_3$, is also in position 1 during this period, as is switch 332, $S_2$. As data and parity bits are received at switch 332, $S_2$, the feedback shift register is cycled, which effectively multiplies the contents thereof by $\alpha$ as described above. A "1", by adding the received bit to adders 322 and 326 which feed into register 310 and 316. Since, as described above, registers 310 and 316 represents the Galois field elements $\alpha^1$ and $\alpha^4$, respectively, and $\alpha^1 + \alpha^4$ is equal to $\alpha^8$, the product $C_i\alpha^8 = 1 \cdot \alpha^8$ is added to the feedback shift register if the received bit is a "1" and the product $C_i\alpha^8 = 0$ is added to the shift register if the received bit is "0". When the last bit is received, being bit $C_8$, a parity bit, the feedback shift register is shifted i.e. cycled, and $C_8\alpha^8$ is added to the feedback shift register, following which registers 308 to 320 contain the representation of the sum $$\sum_{i=8}^{223} C_i \alpha^i$$

(i.e. the coefficients of the 7 degree polynomial corresponding to the sum).

The parity of the 7 bits contained in registers 308 to 320 and representing the sum $$\sum_{i=8}^{223} C_i \alpha^i$$

is determined by the combination of logic devices consisting of binary adder 336, register 338 and inverter 340. One input to adder 336 is the value of the feedback bit of the feedback shift register, the feedback bit being the bit shifted out of register 320 and into register 308 upon each cycle of the feedback shift register. The feedback bit is also added, by binary adder 324, to the contents of register 312 upon each cycle of the shift register. If the feedback bit is a "1" then a "1" is removed from the feedback shift register once (i.e. shifted out of register 320) and added to the feedback shift register twice (i.e. the feedback bit shifted into register 308 and the feedback bit added modulo 2 to the contents of register 312 and shifted into register 314). Thus, overall, one "1" (an odd number of 1's) is added to the feedback shift register, causing the parity of the contents of the shift register to change (since an odd parity binary number added to any binary number results in a binary number of the opposite parity). Consequently, each change in the parity of the feedback shift register (which initially is set to 0, i.e. even parity) is monitored to determined the resulting parity of the feedback shift register when it contains the representation of the sum $$\sum_{i=8}^{223} C_i \alpha^i.$$

The feedback bits, one resulting upon each cycle of the shift register are added together by adder 336 to produce a bit in register 338 which corresponds to the parity of the contents of registers 308 to 320 (i.e. the parity of the binary number represented by the feedback shift register). Register 338 is initially set to zero before the first data bit is received so that the first feedback bit shifted out of register 320 is shifted into register 338. Upon each successive cycle of the feedback shift register, a feedback bit is added, by binary adder 336, to the value in register 338 until the time at which all data bits and parity bits have been received at switch 332, $S_2$, when register 338 contains either a "1" (if the parity of the feedback shift register has changed an odd number of times and therefore has odd parity) or a "0" (if the parity of the feedback shift register has changed an even number of times and therefore has even parity). Inverter 340 inverts the bit in register 338 to produce a parity bit for the Carleton codeword. This bit is a "1" if the sum $$\sum_{i=8}^{223} C_i \alpha^i$$

has even parity, or a "0" if the sum $$\sum_{i=8}^{223} C_i \alpha^i$$

has odd parity. Switch 330, $S_4$, switches to position 2 following the receipt of all data bits and parity bits at switch 332, $S_2$, and the parity bit for the Carleton codeword, appearing at the output of inverter 340, is transmitted 342 (i.e. bit $C_7$ of the encoded data block). When switch 330, $S_4$, is in position 2 and the parity bit of the Carleton codeword is being transmitted, the feedback shift register is not cycled. That is, the cycling of the shift register is skipped by 1 bit, while the parity bit at switch 330, $S_4$, position 2, is transmitted. Cycling of the feedback shift register resumes following the transmission of the parity bit of the Carleton codeword and switch 330, $S_4$, is switched to position 3 at that time.

To complete the discussion of the process of calculating the parity of the shift register, it should be mentioned that the parity of the shift register is never changed by the addition of $C_i\alpha^8$ i.e. by the addition of the bit received at switch 332, $S_2$, to registers 310 and 316 by binary adders 322 and 326. This is because the bit is added twice (i.e. an even number) to the shift register and two "1" bits or two "0" bits added to a binary number does not change the parity of that number since an even parity binary number added to any binary number z results in a binary number having the same parity as the number z. Consequently, it is unnecessary to monitor the bit received at switch 332 since it does not produce parity changes in the feedback shift register.

Following the receipt of all data and parity bits at switch 332, $S_2$, at which time registers 308 to 320 represent the sum $$\sum_{i=8}^{223} C_i \alpha^i,$$

or, alternatively, following the transmission of the Carleton code parity bit, switch 328, $S_3$, is switched to position 2 so that the contents of registers 308 to 320 are not modified by the addition of the feedback bit from register 320 as the feedback shift register is cycled. The feedback shift register is cycled following the transmission of the Carleton codeword parity bit, $C_7$, causing the contents of register 320 to be transmitted 342. As the shift register shifts out the contents of register 320, switch 332, $S_2$, switches to position 2 and the value of the Carleton codeword parity bit at the output of inverter 340 is added to the value in register 308 and register 314, representing $\alpha^0$ and $\alpha^3$, respectively. As discussed earlier in more detail, the addition of $1+\alpha^3$ (i.e. equal to $\alpha^7$), to the sum $$\sum_{i=8}^{223} C_i \alpha^i,$$

is necessary if the parity of the sum is even, to ensure that the sum $$\sum_{i=0}^{223} C_i \alpha^i$$

is zero. That is, the addition of a "1" parity bit, $C_7$, effectively adds the value $\alpha^7$ to the codeword and so, adding $\alpha^7$ again effectively cancels the algebraic effect of the addition of the "1" parity bit. Accordingly, the value $1+\alpha^3$ is added to the feedback shift register as the bit in register 320, bit $C_6$ of the Carleton codeword, is shifted out.

When bit $C_6$ of the Carleton codeword is shifted out of the feedback shift register, switch 332, $S_2$, is switched to position 3 so that the contents of the feedback shift register does not undergo further additions. The shift register is then cycled successively (six times) until the contents of registers 310 to 320 have been shifted out and transmitted 342 as bits $C_5$ through $C_0$ of the Carleton codeword. When bit $C_0$ has been shifted out the feedback shift register, the encoded data block, $C_{223}$ to $C_0$, has been transmitted 342, comprising 27 parity encoded data bytes and 1 Carleton code error correction byte.

Appropriate clocking means to operate the discrete logic devices and switches of FIG. 7 and appropriate means to re-set logic devices (where necessary) are not illustrated in FIG. 7, but can be designed and implemented by anyone skilled in the art according to the desired received data bit rate and circuit devices selected. Each of the circuit devices illustrated in FIG. 7 are basic logic devices known to anyone skilled in the art and any such person is capable of selecting appropriate (i.e. compatible) devices available in the marketplace to produce appropriate circuitry according to that shown in FIG. 7 and described above.

Figure 8:
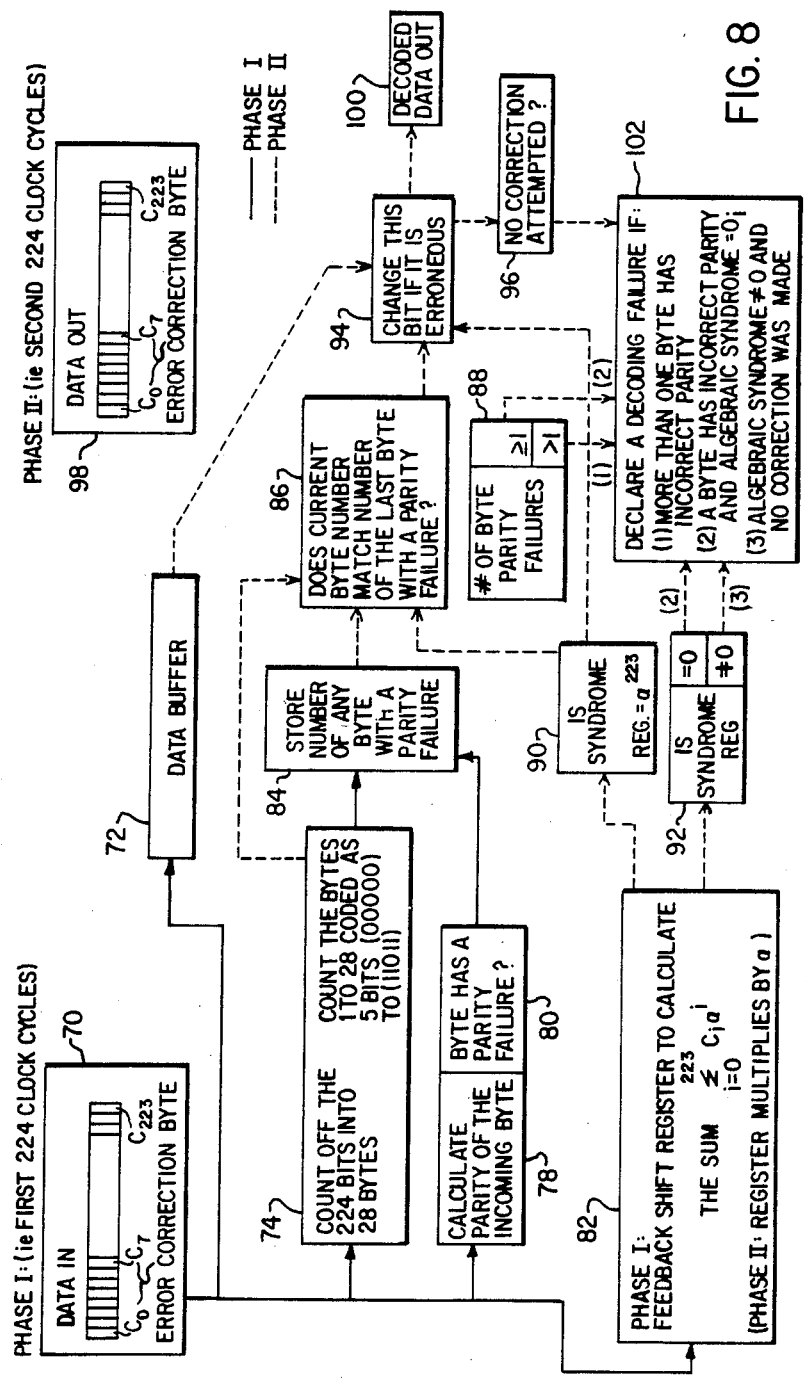
FIG. 8 is a block diagram of an apparatus for decoding a block of data encoded with a Carleton Code error correction byte.

The Decoder (i) A decoder capable of utilizing all elements of GF($2^7$):

Referring to FIG. 8 there is illustrated, in block diagram form, an apparatus to decode a block of data bytes having one Carleton Code byte. In Phase I, 224 data bits in form 70 are shifted into a data buffer 72. Contemporaneously each bit is fed into the following:
  (1) counting means 74, to count the bytes (1 to 28) corresponding to each 8 bit count;
  (2) parity check means 78 to calculate the parity of each 8 bit sequence corresponding to one byte; and
  (3) feedback shift register means 82 to determine the 7 bit Galois field element $\alpha^i$, corresponding to each bit $C_i$, and determine the sum $$\sum_{i=0}^{223} C_i \alpha^i.$$

The count of counting means 74 is stored 84 when the parity of the data byte is determined by means 80 to be incorrect. After all of the data bits have been shifted into the data buffer 72 Phase II commences. The bits in data buffer 72 are then successively shifted out of the buffer 72 so that the first bit shifted into the buffer 72 is also the first bit out of the buffer 72 (i.e. FIFO) 98.

Following the input of all of the data bits shifted into the buffer 72 the sum held by the feedback shift register 82 contains 0, if a single bit error has not occured, or $\alpha^i$, corresponding to $C_i$ or $C_{i+127}$, if a single bit error has occurred.

Phase II (data out phase) of the decoding method of FIG. 6 is next considered. During Phase II there is no data input to buffer 72, counting means 74, parity check means 78, or shift register 82.

During the subsequent register shifts, wherein the data bits are shifted out of buffer 72 and there is no input to feedback shift register 82, the feedback shift register 82 is cycled synchronously with the shifting out of data bits from the buffer 72 so that with each cylce the contents of the register 82, being either 0 or $\alpha^i$, is multiplied by $\alpha$ (i.e. summatation with a data bit is not performed). Comparing means 90 monitors the contents of register 82 and when it equals $\alpha^{223}$ a flag is sent to means 94 to determine if the current output bit should be changed. Contemporaneously with said cycling of register 82, the counting means 74 counts bytes (1–28) corresponding to each 8 bits shifted out of buffer 72. Comparing means 86 compares the byte number of the current output bit to the stored byte number of a byte having incorrect parity and a flag is sent to correction means 94 causing said means 94 to change the current output bit if the current byte number is the same as that having incorrect parity and the contents of register 82 is $\alpha^{223}$. That is, both conditions must occur. It will be apparent to the reader that if register 82 holds the value of $\alpha^i$ when all data bits have been shifted into the buffer 72 (i.e. at the end of Phase I) then if the register 82 is cycled repetitively as successive bits are shifted out of the buffer 72 until it reaches a value of $\alpha^{223}$, the bit being shifted out of buffer 72 at that time is $C_i$ (i.e. the data bit correlated to $\alpha^i$) because the first bit shifted into buffer 72 is also the first bit shifted out in Phase II.

To determine whether a decoding failure has occurred three determinations are necessary in Phase II:

(1) means 88 to count at least two bytes having incorrect parity and setting a decoding failure flag if the count is greater than 1;

(2) comparing means 92 determines whether the value of the register 82, sometime after all data bits have been shifted into buffer 72, is zero and determines from counting means 88 whether the number of bytes having incorrect parity is greater than or equal to one. Decoding failure is flagged when register 82 is zero and the number of bytes having incorrect parity is greater than or equal to one; and (3) means 96 to determine whether a correction was made to a data bit (after all data bits have been shifted out of buffer 72) and means to determine if the value of register 82 is non-zero. If a correction was not made and register 82 is non-zero a decoding failure flag is set.

It will be evident to the reader that there are many different circuit devices, or combinations thereof, made by a multitude of manufacturers, to perform the operations indicated in FIG. 8. One embodiment of a decoder which functions according to the flow chart of FIG. 8 is depicted by the logic circuitry of FIG. 9 to decode a data block of 224 bits encoded with a Carleton Code error correction byte.

Figure 9:
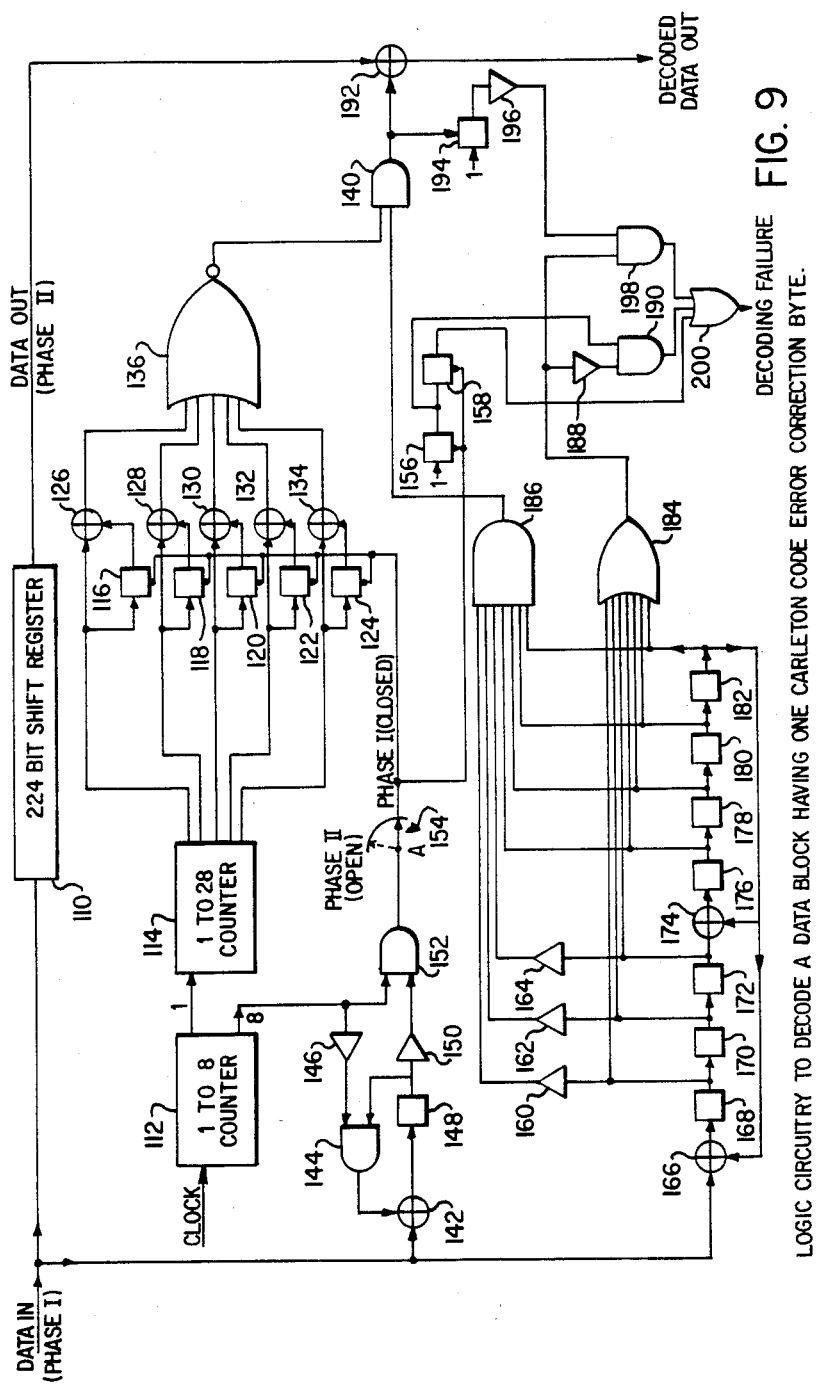
FIG. 9 is a schematic diagram of an apparatus for decoding a block of data encoded with a Carleton Code error correction byte.

Referring now to FIG. 9 a 224 bit shift register 110 is selected as the data buffer 72 of FIG. 8. A 1 to 8 counter 112 is selected to count data bits as the bits are shifted into register 110 (Phase I) and as they are shifted out of register 110 (Phase II), and a 1 to 28 counter 114 is selected to count data bytes as they are shifted into register 110 (Phase I) and shifted out of register 110 (Phase II), corresponding to block 74 in FIG. 8. During Phase I switch A is closed so that a parity failure occurring in a data bit triggers the binary registers 116, 118, 120, 122 and 124 and causes the count of counter 114 to be entered into said binary registers 116, 118, 120, 122 and 124 so that the number of a data byte having incorrect parity is stored in registers 116, 118, 120, 122 and 124. (i.e. Registers 116, 118, 120, 122 and 124 each represent 1 bit of a 5-bit number ranging from 1 to 28.)

To determine the parity of the data bytes the circuitry selected comprises binary adder 142, binary register 148, AND gates 144 and 152 and inverters 146 and 150. Binary adder 142 performs modulo 2 arithemetic (i.e. $1+1=0$). A clock, synchronous with the shifting of data bits in and out of register 110, is used to drive the circuitry of FIG. 9 (e.g. the counters 112 and 114) and can easily be produced according to known methods, whereby the desired frequency of the clock is the desired frequency of data bit shifts. We can assume the register 148 is cleared, initially, so that it contains zero and that the first input bit gets shifted into register 148 (having been added by binary adder 142 to "0"). The eighth bit of counter 112 is low (i.e. a "0") until eight data bits have been counted and there have been eight bits shifted into register 148. Therefore, the input to AND gate 144 from counter 112 is high (i.e. a "1") after bits 1 to 7, of each input data byte, have been shifted into register 148, having been inverted by inverter 146. Since the output of inverter 146 is high for each input bit 2 to 8, of each input data byte, bits 1 to 8 are added to each other successively. Also, when bits 2 to 8, of each input data byte, are shifted in the output of AND gate 144 will be equal to the last bit shifted in. That is, the value of register 148 will be the sum of bits in each 8 bit data byte which have been shifted in at that point in time. Once eight bits have been counted AND gate 144 goes low because the eighth bit of counter 112 will be high and therefore the input to AND gate 144, being the output of inverter 146, will be low. Therefore, after eight data bits have been counted the value of the next data bit is input into register 148, having been added to zero. The above is then repeated so that as soon as each 8 bit data byte has been shifted into register 110 register 148 holds the value of the parity of that byte, namely "1" if the byte had odd parity or "0" if the byte had even parity. Since odd parity is chosen for the data of FIG. 9, a "0" appearing in register 148 following the input of the eighth bit of a data byte, indicates that that byte had incorrect parity. Accordingly, AND gate 152, which triggers registers 116, 118, 120, 122 and 124, will become high at the time since the input to AND gate 152 is the value of register 148 inverted by inverter 150 and the value of the eighth bit of counter 112 which is high after each eighth data bit has been counted. The current byte number of counter 114 is then shifted into registers 116, 118, 120, 122 and 124 when AND gate 152 is high due to the current byte having incorrect parity. If more than one data byte has incorrect parity the previous byte number in registers 116, 118, 120, 122 and 124 is replaced with the new byte number of a byte having incorrect parity and the previous number is not retained. However, registers 156 and 158 provide means to store the occurrence of up to 2 bytes having incorrect parity. Registers 156 and 158 are triggered by AND gate 152 and after a byte has been found to have incorrect parity a 1 will be shifted into register 156. If two bytes are found to have incorrect parity then both registers 156 and 158 will be high, the 1 in register 156 having been shifted into register 158 and a 1 shifted into register 156, and each can be tested to determine whether one or more data bits were received with incorrect parity.

The feedback shift register 82 of FIG. 8, to calculate the sum $$\sum_{i=0}^{223} C_i \alpha^i$$

(Phase I), is implemented by registers 168, 170, 172, 176, 178, 180 and 182 and binary adders 166 and 174 of FIG. 9. It will be apparent to the reader that the basic feedback shift register comprising registers 168, 170, 172, 176, 178, 180 and 182 together with binary adder 174 is the shift register configuration of FIG. 2, discussed above, to multiply the contents thereof by $\alpha$ upon each shift of the register. Binary adder 166 functions to add (modulo 2) the input data bit, $C_i$, to the 7 bit value represented by registers 168, 170, 172, 176, 178, 180 and 182 immediately following the multiplication of the contents of the shift register by $\alpha$. Each such multiplication and addition occurs upon each cycle of the shift register (which occurs upon the input of a data bit, $C_i$). That is, the sum $$\sum_{i=0}^{223} C_i \alpha^i$$

is determined by the equivalent means ( . . . $((C_{223}\alpha + C_{222})\alpha + C_{221})\alpha$ . . . $+C_0$, so that after the last data bit has been shifted into register 110, being bit $C_0$, registers 168, 170, 172, 176, 178, 180 and 182 will represent the 7 bits sum $$\sum_{i=0}^{223} C_i \alpha^i,$$

being the Galois field element, $\alpha^i$, of a bit, $C_i$, being erroneous. (Assuming a single bit error.)

At the end of Phase I, registers 168, . . . , 182 contain the representation of $\alpha^i$ if bit $C_i$ or $C_{i+127}$ was received in error.

Following the input of all data bits into register 110, identified as Phase I in FIGS. 8 and 9, the data bits are shifted out of register 110 in the same order that they were shifted into the register (i.e. FIFO), identified as Phase II in FIGS. 8 and 9. During Phase II the clock continues to cycle thereby causing registrs 110, 168, 170, 172, 176, 178, 180 and 182 to shift upon each clock cycle and counter 112 and 114 to count the data bits as they are shifted out of register 110. Switch A is open during Phase II so that the value of registers 116, 118, 120, 122 and 124, representing the last byte number to show a parity failure, is preserved. If there has been a bit error in the data bits, the value of registers 168, 170, 172, 176, 178, 180 and 182 will be non-zero and equal to $\alpha^i$ so that when registers 168, 170, 172, 176, 178, 180 and 182 have shifted from the value $\alpha^i$ to $\alpha^{223}$ (i.e. 0001111) the current bit being shifted out of register 110 will be $C_i$ corresponding to $\alpha^i$, and may be erroneous. The output of AND gate 186 will become high when registers 168, 170, 172, 176, 178, 180 and 182 hold the value $\alpha^{223}$. Also, the output of NOR gate 136 will become high if the current byte number of counter 114 is equal to the number of the last byte to have incorrect parity which is stored in registers 116, 118, 120, 122 and 124. That is, the bits of the stored byte number are added (by binary modulo 2 arithmetic) using adders 126, 128, 130, 132 and 134 to the bits of the current byte number so that it is only when the sum of each is zero (i.e. when they are all equal) that NOR gate 136 goes high. if NOR gate 136 is high (i.e. the byte number of the current bit being shifted out of register 110 is a byte having incorrect parity) and AND gate 186 is high (i.e. registers 168, 170, 172, 176, 178, 180 and 182 represent $\alpha^{223}$) then the current bit being shifted out of register 110 is changed by adding a 1 to it (i.e. $0+1=1$ and $1+1=0$) using binary adder 192.

To determine whether a decoding failure has occured in accordance with block 102 of FIG. 8 three tests are made by OR gate 200 which will go high if any test is positive (i.e. if any input to OR gate 200 is high). One input to OR gate 200 is the value of register 158, which is high if two or more data bytes were calculated to have had incorrect parity. Consequently, OR gate 200 becomes high if register 158 is high due to more than one bit error having occurred. A second input to OR gate 200 is the output of AND gate 190 which is high if the sum $$\sum_{i=0}^{223} C_i \alpha^i$$

equals zero, i.e. if registers 168, 170, 172, 176, 178, 180 and 182 are all zero, and register 156 is high (i.e. if at least one data byte has incorrect parity). Inverter 188 reverses the output of OR gate 184. The output of OR gate 184 is low if registers 168, . . . 182 are all zero. A third input to OR gate 200 is the output of and AND gate 198 which is high if the sum $$\sum_{i=0}^{223} C_i \alpha^i$$

equals zero, i.e. if registers 168, 170, 172, 176, 178, 180 and 182 are all zero, and a data bit, $C_i$, was corrected during Phase II. When a data bit, $C_i$, is corrected during Phase II AND gate 140 is high and a 1 is shifted into register 194. The output of inverter 196 becomes low after a bit, $C_i$, has been corrected during Phase II.

The output labelled "Decoding Failure" in FIG. 9 will be high following the output of the last data bit of bits $C_{223}$ to $C_0$, if a decoding failure has occurred in the last block of data bits $C_{223}$ to $C_0$. The output labelled "Decoded Data Out" in FIG. 9 provides the decoded data block $C_{223}$ to $C_0$.

Figure 10:
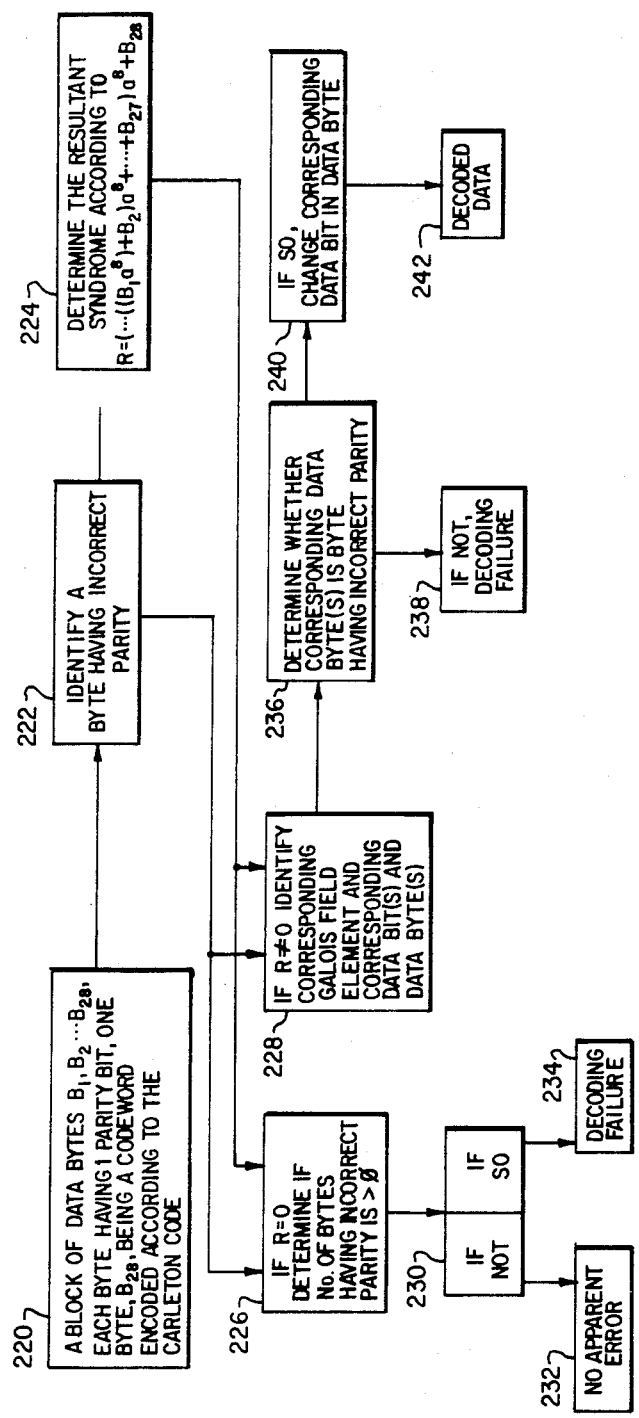
FIG. 10 is a block diagram of an alternative apparatus for decoding a block of data encoded with a Carleton Code error correction byte.

(ii) A decoder utilizing only one element of $GF(2^7)$:

Referring to FIG. 10 there is shown a process to decode a block of data encoded according to the Carleton code, which uses only one Galois field element, $\alpha^8$, to decode the data block.

As illustrated in block 220 of FIG. 10 a block of 28 data bytes, $B_1$ to $B_{28}$, is received wherein each byte has one parity bit and $B_{28}$ is a Carleton code byte. Then the parity of each byte $B_1$ to $B_{28}$ is determined 222 and the sum $$\sum_{i=0}^{223} C_i \alpha^i$$

is calculated 224. The sum $$\sum_{i=0}^{223} C_i \alpha^i$$

is calculated by means of the equivalent relationship ( . . . $((B_1 \alpha^8) + B_2) \alpha^8 + \ldots + B_{27}) \alpha^8 + B_{28} = R$ whereby each data byte is successively added to a cumulative value, as indicated, and multiplied by the Galois field element $\alpha^8$. (This expansion was discussed above under Horner's Method.) The sum is tested 226 to see if it is 0 and if it is and no data bytes have shown incorrect parity then there is no apparent error in the data block 232. If the sum is 0 and at least one data byte has incorrect parity then there has been a decoding failure 234. If the sum R is non-zero it can be correlated to $\alpha^i$ and the data bit(s) and data byte number(s) corresponding to $\alpha^i$ are determined 228. That is, if the sum $$\sum_{i=0}^{223} C_i \alpha^i$$

is, say, $\alpha^{150}$ it could represent $\alpha^{150}$ or $\alpha^{150-127}$ since there are only 127 non-zero Galois field elements and the assignment of Galois field elements to data bits was repeated, as described above. Accordingly, it is possible that two data bytes and two data bits will correspond to the sum R. If the corresponding data byte(s) did not show incorrect parity 236 then a decoding failure has taken place. If one of the corresponding data byte(s) did show parity fialure the corresponding data bit in that byte is changed 240, resultiong in a decoded data block 242.

Figure 11:
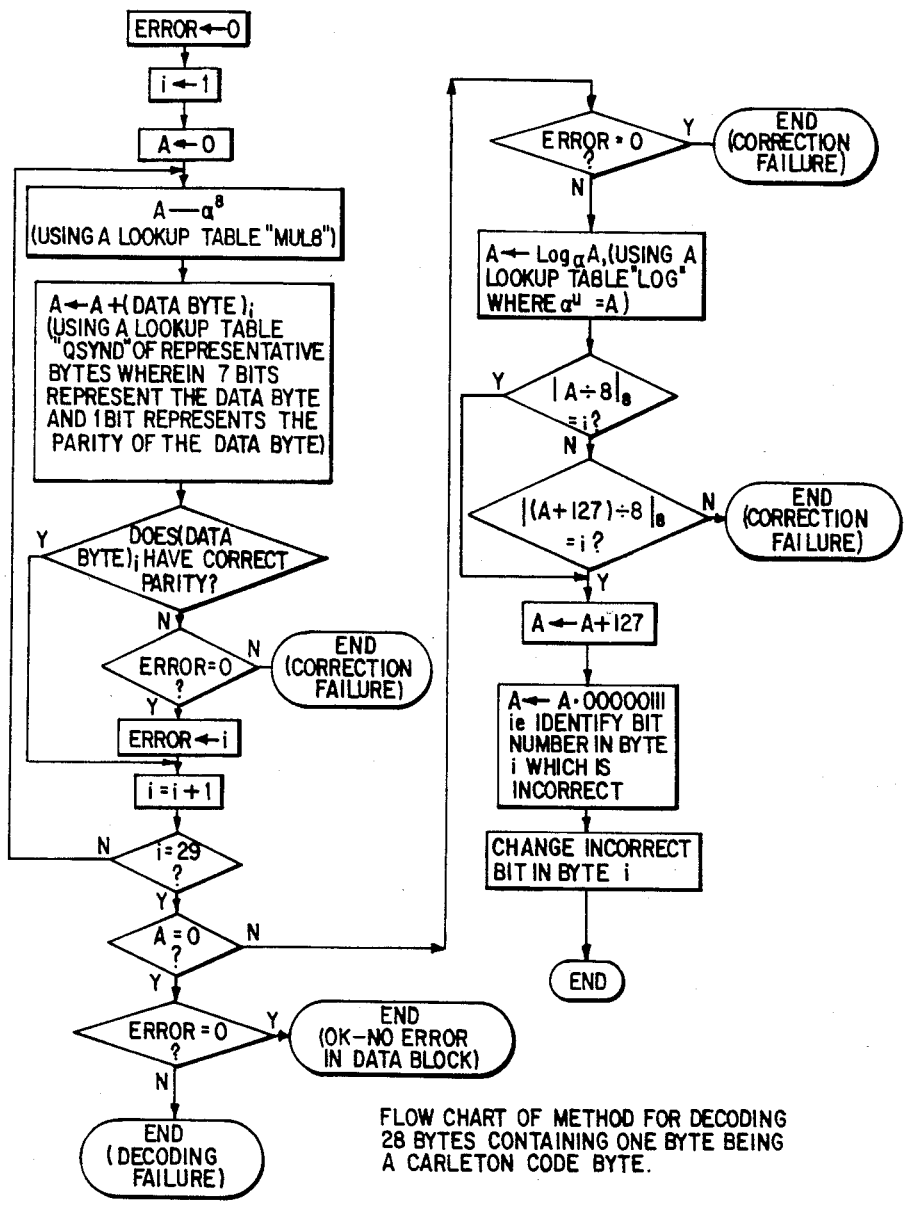
FIG. 11 is a flow chart, illustrating in more detailed form, the steps of the process FIG. 8.

Referring now to FIG. 11 there is shown a flow chart of a method for decoding 28 bytes encoded with one Carleton code byte, which might be implemented efficiently using a microprocessor in conjunction with readable memory accesible to a microprocessor. Three computations are necessary to decode the data in accordance with the method illustrated in FIG. 11. It will be recognized by the reader that the computations might be accomplished using a variety of electronic logic circuits and a multitude of electronic components; however, the preferred embodiment includes a microprocessor and three look-up tables stored in memory, the memory holding the results of the computations, which are read by the microprocessor, thereby reducing computation time and the number of electronic logic components required to perform the computations. Appendix B illustrates a segment of a computer program written in MOTOROLA 6809 microprocessor assembly language which can be incorporated into an appropriate software/hardware system to decode a block of data bytes having a Carleton code error correction byte.

Initially, three variables are set: ERROR, being the variable which will contain the number of data byte having incorrect parity, is set to 0; i, being the variable which will count the data bytes, is set to 1; and, A, being the variable which will hold the cumulative sum to form the sum R of block 224 in FIG. 10, is set to 0.

The variable A is multiplied by $\alpha^8$ using lookup table MUL8 of 128 bytes. As in the program of Appendix B the value of A might be used to address the appropriate byte in table MUL8 holding the product of A and $\alpha^8$. The 128 bytes are necessary for table MUL8 because $B_i \alpha^8$ is a 7 bit element of $GF(2^7)$ which means that $2^7$ different values of $B_i \alpha^8$ are possible (i.e. including 0). Next the "quasi-syndrome" of the data byte is added to the product of A and $\alpha^8$. Again, the "quasi-syndrome" of the data byte may be obtained efficiently from a table (e.g. OSYND in Appendix B) using the data byte itself to address the appropriate table element. The "quasi-syndrome" of a data byte $B_i$ (where, $B_i = b_{i,7}, b_{i,6}, b_{i,5}, b_{i,4}, b_{i,3}, b_{i,2}, b_{i,1}, b_{i,0}$) consists of the sum $$\sum_{j=0}^{7} b_{i,j} \alpha^j$$

in the first 7 bits of the "quasi-syndrome", and the most significant bit is the parity of the data byte $B_i$ (i.e. "1" for odd parity and "0" for even parity).

For example, the "quasi-syndrome" of $B_i = (10010010)$ is the sum defined above, equal to (00011011) plus a parity bit in the most significant bit (10000000), which equals (10011011), where the most significant bit is the leftmost bit in the binary number. If $B_i$ is received as $B_i = (10010000)$ then the "quasi-syndrome" for that byte would be (00011001). Accordingly, the 8th bit indicates that $B_i$ has incorrect parity. It will be apparent to the reader that the "quasi-syndrome" of $B_i$ is the equivalent 7 bit field element corresponding to $B_i$ with a parity check bit in the unused 8th bit. By adding th "quasi-syndrome" of $B_i$ to the product of A and $\alpha^8$ the sum $B_i 60^8 + B_{i+1}$ can be calculated and the parity of $B_{i+1}$ determined at the same time. That is, $B_i \alpha^8$, a 7 bit number, will always have zero in the 8th bit, while the "quasi-syndrome" of $B_{i+1}$ will have a 0 in the eighth bit only if $B_{i+1}$ was received with incorrect parity. The 8th bit of the result of $B_i \alpha^8 + B_{i+1}$ is checked and if it is zero then the data byte $B_{i+1}$ had incorrect parity and the byte number of the byte having incorrect parity is stored in variable ERROR, which stores the number of a byte having incorrect parity. Then, the variable i containing the current byte number is incremented and the above process is repeated, beginning with the product of the current value of A and $\alpha^8$, until i is equal to 29 (i.e. all data bytes have been processed). The value in variable A when i is equal to 29 is the sum R described above. If the value in A is zero and there has been a data byte number stored in the variable ERROR, due to an incorrect parity occurring in a data byte, there has been a decoding failure. If both A and ERROR are zero then it is assumed that the data block was received without error. If the value of A is non-zero but a byte was not found to have incorrect parity a decoding failure has occurred.

When A is zero and a byte number of a byte having incorrect parity has been stored in the variable ERROR the bit number (0 to 223) corresponding to the field element in A is calculated. To do so a lookup table may be used (e.g. LOG in Appendix B), consisting of 127 elements, each element being the logarithm to the base $\alpha$ of a possible field element. Since A contains a 7 bit field element, $\alpha^i$ ($0 \leq i \leq 126$), there are $2^7 - 1$ possible values of A for which log $\alpha A$ (equal to i) exists. (As explained above, $\alpha^i$ corresponds to data bits $C_i$ where $0 \leq i \leq 223$; however, the sequence $\alpha^i$, $0 \leq i \leq 126$, is repeated for $C_{127}$ to $C_{223}$.) The value A may be used to address the appropriate element of a table of logarithms to determine the value i efficiently.

The logarithm of A is then matched to corresponding byte numbers. That is, the bytes containing $C_{log \alpha A}$ and $C_{(log \alpha A + 127)}$. If the number of one of those bytes is equal to the number stored in the variable ERROR, of a byte having incorrect parity, then the bit $C_{log \alpha A}$ or $C_{(lo-}$ $g\alpha_{A+127}$) contained in that byte is the bit in error and is changed. If neither byte number corresponding to $C_{log\alpha_A}$ or $C_{(log\alpha_A+127)}$ equals the byte number stored in the varible ERROR there has been a correction failure.

The present invention, and embodiments thereof, described above permit correction of the single bit error occurring in a data block of bits which block includes a parity check bit in each data packet. If more than one bit error has occurred a decoding failure will be identified but correction of more than one error is not effected. The embodiments illustrated above to encode an decode data blocks enable efficient implementation of the present invention.

Those skilled in the art will recognize that there are a multitude of variations of the embodiments of the present invention, described in detail above. The examples illustrated are given only to teach the reader preferred embodiments of the present invention and not intended to limit the present invention to those illustrations. The illustrated embodiments, and variations thereof, may be made without departing from the scope of the present invention which is defined in the appended claims.

I claim:

1. A single bit error correction encoding apparatus for producing an error correction packet for transmission in a data block, said error correction packet having M bits, one of which M bits is a parity check bit, wherein,
   (i) said data block consists of said error correction packet and (L−1) data packets, each of said data packets having M bits and the same predetermined parity, one of said M bits of each of said (L−1) data packets being a parity check bit, whereby both "L" and "M" are positive integers;
   (ii) the symbol $C_i$ represents the binary value of the ith bit in said data block such that the bit sequence $(C_0, C_1, C_2, \ldots C_N)$ represents the binary values of the sequence of bits in a data block of length (N+1) bits, whereby N+1+ML, "N" being a positive integer and "i" being an integer greater than or equal to 0 and less than or equal to N;
   (iii) the bit sequence $(C_{jM}, C_{jM+1}, C_{jM+2}, \ldots C_{jM+(M-1)})$ represents the values of each of the M bits of said error correction packet being the (j+1)st packet of said data block, whereby j is a positive integer greater than or equal to 0 and less than or equal to (L−1); and,
   (iv) the symbol $\alpha$ represents a primitive element of a Galois Field $GF(2^{M-1})$, $\alpha$ being a root of a primitive polynomial Q(X) of degree (M−1), and where the arithmetic operation addition is performed according to modulo 2 arithmetic;

said encoding apparatus comprising:
(a) evaluation means for evaluating the sum T having an expansion as a pattern of (M−1) bits, whereby $$T = \sum_{i=0}^{jM-1} C_i\alpha^i + \sum_{i=jM+M}^{N} C_i\alpha^i,$$

if j is not equal to 0 or (L−1) or, $$T = \sum_{i=M}^{N} C_i\alpha^i,$$

if j is equal to 0, or, $$T = \sum_{i=0}^{(L-1)M-1} C_i\alpha^i,$$

if j is equal to L−1; and,
(b) selection means for selecting said error correction packet such that:
   (i) said selection means produces a sequence of bits $(C_{jM}, C_{jM+1}, \ldots C_{jM+(M-1)})$ satisfying the relationship expressed as:

$$\sum_{i=jM}^{jM+(M-1)} C_i\alpha^i = T,$$

whereby T is the sum of said evaluation means; and,
   (ii) said sequence of bits $(C_{jM}, C_{jM+1}, \ldots C_{jM+(M-)})$ has the same predetermined parity as that of each of said data packets of said data block.

2. The apparatus of claim 1, wherein:
L=28;
M=8;
N=223;
Q(X)=$X^7X^3$+1; and
j=0.

3. The apparatus of claim 2 wherein said predetermined parity is odd parity and said selection means includes:
(a) first bit production means for producing a sequence of bits $(t_0, t_1, \ldots t_6)$, the values of said bits satisfying the relationship $$T = \sum_{i=0}^{6} t_i\alpha^i,$$

whereby T is the sum of said evaluation means;
(b) parity testing means for testing whether said bit sequence $(t_0, t_1, \ldots t_6)$ has odd parity or even parity; and
(c) second bit production means for producing said error correction packet comprising the bit sequence $(C_0, C_1, \ldots C_7)$ equal to $(t_0+1, t_1, t_2, t_3+1, t_4, t_5, t_6, 1)$, if said testing means determines that said sequence of bits $(t_0, t_1, \ldots t_6)$ has even parity, or $(t_0, t_1, t_2, t_3, t_4, t_5, t_6, 0)$, if said testing means determines that said sequence of bits $(t_0, t_1, \ldots t_6)$ has odd parity.

4. The apparatus of claim 1 further comprising bit positioning means for positioning the bits of said error correction packet in said data block at the jMth through to the (jM+M−1)th bit positions.

5. A single bit error decoding apparatus for decoding a received data block, said data block comprising (L−1) data packets and one error correction packet, each of said packets consisting of M bits, said data block having been previously encoded such that
   (i) each packet of said data block was produced having the same predetermined parity; and
   (ii) said error correction packet was produced such that the value of the sum represented by $$\sum_{i=0}^{N} C_i\alpha^i$$

equaled zero, wherein the symbol $C_i$ represents the binary value of the ith bit in said previously encoded data block and the bit sequence $(C_0, C_1, C_2, \ldots C_N)$ represents the binary values of the sequence of bits comprising said encoded data block of length $(N+1)$ bits, whereby $N+1=ML$, "N", "L" and "M" are positive integers, "i" is an integer greater than or equal to 0 and less than or equal to N, and the symbol $\alpha$ represents a primitive element of the Galois Field GF $(2^{M-1})$, $\alpha$ being a root of a primitive polynomial $Q(X)$ of degree $(M-1)$;

said decoding apparatus comprising:
(a) parity error identification means for identifying any one of said received packets not having said predetermined parity;
(b) evaluation means for evaluating the sum R whereby $$R = \sum_{i=0}^{N} r_i \alpha^i,$$

wherein the symbol $r_i$ represents the binary value of the ith bit of said received data block such that the bit sequence $(r_0, r_1, r_2, \ldots r_N)$ represents the binary values of the received sequence of bits of said data block; and
(c) bit correction means for correcting an incorrect bit in said received data block said correcting means comprising means to identify and change bit $r_g$ in the $(k+1)$st packet of said received data block wherein the value g is determined from the sum R of said evaluation means according to the relationship $R = \alpha^g$ such that $MK \leq g \leq (MK+M-1)$, K being an integer greater than or equal to 0 and less than or equal to $(L-1)$, the $(K+1)$st packet having been identified by said parity error identification means as having other than said predetermined parity.

6. The apparatus of claim 5, wherein
$L = 28$;
$M = 8$;
$N = 223$;
$Q(X) = X^7 + X^3 + 1$; and
$j = 0$.

7. The apparatus of claim 5 or claim 6 wherein said parity error identification means comprises two-packet parity error identification means capable of identifying at least two packets of said received data block not having said predetermined parity, said decoding apparatus further comprising decoding failure signalling means for signalling that a decoding failure has occurred when any of the following events occur:
(a) the number of packets identified by said parity error identification means exceeds unity; or,
(b) the sum R of said evaluation means is equal to zero and one or more packets have been identified by said parity error identification means; or,
(c) the sum R of said evaluation means is not equal to zero and no packet has been identified by said parity error identification means.

8. An encoding apparatus for encoding the bits of a block of $(L-1)$ data packets, each data packet consisting of M bits whereby one of said M bits is a parity check bit, "L" and "M" are positive integers and said bits are representable as the sequence $(C_0, C_1, C_2 \ldots C_{[M(L-1)]-1})$, said apparatus comprising:
(a) a Galois Field element generator for generating elements of the Galois Field GF $(2^{M-1})$, each of said elements being representable in polynomial form;
(b) multiplication means for multiplying the value of each bit $C_i$ of said block by the corresponding Galois Field Element $\alpha^i$ of $GF(2^{M-1})$ and identifying the product $C_i\alpha^i$, wherein the symbol $C_i$ represents the binary value of the ith bit in said block, i being an integer greater than or equal to 0 and less than or equal to $M(L-1)-1$, and $\alpha$ represents a primitive element of the Galois Field $GF(2^{M-1})$ said primitive element being a root of a primitive polynomial of degree $(M-1)$;
(c) summation means for identifying, using modulo 2 arithmetic, the sum of the products identified by said multiplication means said sum being a binary representation of one of said elements of said Galois Field $GF(2^{M-1})$;
(d) parity identification means for identifying the parity of said sum produced by said summation means;
(e) bit generating means for generating an M-bit error correction packet representable as the bit sequence $(C_{M(L-1)}, C_{M(L-1)+1}, \ldots C_{ML-1})$ comprising one parity check bit, the bits of said error correction packet determined from the sum identified by said summation means and the parity of the same identified by said parity identification means such that the sum represented by $$\sum_{i=0}^{ML-1} C_i \alpha^i \text{ equals zero.}$$

9. A decoding apparatus for correcting a single bit error occurring in one packet of a received data block said data block representable as the sequence $(r_0, r_1, r_2, \ldots r_{ML-1})$ and comprising $(L-1)$ data packets and one error correction packet, each said packet comprising M bits, whereby $r_i$ represents the ith bit of said received data block, "L" and "M" are positive integers, and "i" is an integer greater than or equal to 0 and less than or equal to $(ML-1)$ said received data block having been previously encoded such that
(i) each packet of said data block was produced having the same predetermined parity; and
(ii) said error correction packet was produced such that the value of the sum represented by $$\sum_{i=0}^{N} C_i \alpha^i$$

equaled zero, wherein the symbol $C_i$ represents the binary value of the ith bit in said previously encoded data block and the bit sequence $(C_0, C_1, C_2, \ldots C_N)$ represents the binary values of the sequence of bits comprising said encoded data block of length $(N+1)$ bits, whereby $N+1=ML$, "N", "L" and "M" are positive integers, "i" is an integer greater than or equal to 0 and less than or equal to N, and the symbol $\alpha$ represents a primitive element of the Galois Field $GF(2^{M-1})$, $\alpha$ being a root of a primitive polynomial $Q(X)$ of degree $(M-1)$;

said decoding apparatus comprising:
(a) parity error identification means for identifying the parity of at least one packet of said received data block not having said predetermined parity;

(b) a Galois Field element generator for generating elements of the Galois Field $GF(2^{M-1})$, each of said elements being representable in polynomial form;

(c) multiplication means for multiplying the value of each bit $r_i$ of said received data block by the corresponding Galois Field element $\alpha^i$ of $GF(2^{M-1})$ and identifying the product $r_i\alpha^i$;

(d) summation means for identifying, using modulo 2 arithmetic, the sum R being the sum of the products identified by said multiplication means;

(e) bit correction means for correcting an erroneous bit occurring in said received data block said correction means comprising means to identify and change bit $r_g$ in the (k+1)st packet of said received data block wherein the value g is determined from the sum R identified by said summation means according to the relationship $R=\alpha^g$ such that $MK \leq g \leq (MK+M-1)$, K being an integer greater than or equal to 0 and less than or equal to (L−1), the (k+1)st packet having been identified by said parity error identification means as not having said predetermined parity.

10. An apparatus for encoding a sequence of data bits to permit subsequent correction of a single bit error occurring in said sequence, whereby said sequence includes ij data bits, said encoding producing a data block comprising j parity encoded data packets and one error correction packet each said packet comprising (i+1) bits, "i" and "j" both being positive integers, said apparatus comprising:

(a) parity identification means for identifying the parity of a group of said data bits, said group consisting of i data bits;

(b) first bit generating means for generating a parity bit for said group and incorporating said parity bit into said group of data bits, said parity bit and data bits forming a parity encoded data packet having (i+1) bits, whereby the value of said parity bit is dependant upon the parity of said group of data bits identified by said parity identification means such that the resulting parity encoded data packet has predetermined parity;

(c) second bit generating means for generating a digital signal having i bits, each of said bits representing a coefficient of a polynomial of degree (i−1), said polynomial being of the form $(a_0\alpha^0+a_1\alpha^1+ \ldots a_{i-1}\alpha^{i-1})$ and representing an element of the Galois Field $GF(2^i)$, said element corresponding to the sum $$\sum_{k=i+1}^{j(i+1)-1} C_K\alpha^K,$$

whereby the value of coefficient $a_0, \ldots, a_{i-1}$ is either "0" or "1", $\alpha$ is a root of a primitive polynomial of degree i, j is the number of data packets generated by said first bit generating means and $C_K$ is the value of a bit in the sequence of bits comprising said data packets said sequence of bits represented as the sequence $(C_{i+1}, C_{i+2}, \ldots C_{j(i+1)-1})$ whereby "K" is a positive integer;

(d) parity encoding means for parity encoding said digital signal thereby producing an error correction packet having said predetermined parity said parity encoding means identifying the parity of said digital signal and adding, modulo 2, to said digital signal a bit sequence of one or more bits which when added to said digital signal results in a bit sequence having (i+1) bits representable as the sequence $(C_0, C_1, \ldots C_i)$ such that the sum $$\sum_{k=0}^{j(i+1)-1} C_K\alpha^K$$

equals zero, said bit sequence $(C_0, C_1, \ldots C_i)$ being said error correction packet.

11. The apparatus of claim 10 wherein the value of i is 7.

12. The apparatus of claim 11 wherein said second bit generating means receives said bits comprising said data packets in the order $(C_{j(i+1)-1}, C_{j(i+1)-2}, \ldots C_{i+1})$, said second bit generating means including a feedback shift register for receiving said sequence of bits, said shift register being configured to represent the element of said Galois Field $GF(2^i)$ corresponding to said sum $$\sum_{k=i+1}^{j(i+1)-1} C_K\alpha^K,$$

following the receipt of all of said data packets.

13. An apparatus for encoding a block of data packets consisting of bits to permit subsequent correction of a single bit error occurring therein, each of said packets consisting of i bits, "i" being a positive integer, wherein the value of the bit in a preselected sequence position in each of said data packets sets the parity of said packet to a predetermined parity, said apparatus comprising:

(a) means for receiving said block of data packets;

(b) means to multiply one of said data packets by the element $\alpha^i$ of the Galois field $GF(2^{i-1})$ to form a partial product containing the same number of bits as said data packets, said element $\alpha^i$ being the ith power of the root $\alpha$ of a primitive polynomial of degree i−1 whereby $\alpha$ represents a primitive element of said Galois field $GF(2^{i-1})$;

(c) means to add, by binary arithmetic, one of said data packets to said partial product to form a partial syndrome;

(d) means to mutiply said partial syndrome by said Galois field element $\alpha^i$ to form a partial product said product containing the same number of bits as said data packets; and, (e) means to repetitively engage said means of paragraphs (c) and (d) above until all of said data packets have been added to a partial product, forming a resultant syndrome, and said resultant syndrome has been multiplied by said Galois field element $\alpha^i$ to form a resultant product having the same parity as said data packets, said resultant product being the error correction packet of said block of data packets.

14. Apparatus according to claim 13 including means to temporarily store said packets of said block of data packets.

15. Apparatus according to claim 14 wherein the value of i is 8.

16. Apparatus according to claim 15 wherein said means to multiply one of said data packets by said element $\alpha^i$ includes a microprocessor.

17. An apparatus for decoding a data block comprising data packets and one error correction packet, each of said packets comprising a sequence of i bits whereby "i" is a positive integer and one of said i bits is a parity bit, to permit correction of a single bit error occurring in said data block, comprising:

(a) receiving means to receive said data block;

(b) parity determining means to determine the parity of each of said packets of said data block;

(c) parity error identification means to identify at least one of said packets having incorrect parity;

(d) first storing means to temporarily store said received data block;

(e) Galois Field element generating means to generate digital signals representative of the elements of a Galois Field said elements being correlated to said bits of said packets according to the position of the bit relative to the remaining bits of said data block, wherein said Galois Field has $2^{(i-1)}$ elements;

(f) summing means to determine the modulo 2 sum of selected ones of said digital signals whereby a data signal is included in said sum if the bit correlated to said signal is a predetermined value and not included if the bit correlated to said signal is not said predetermined value; and (g) incorrect bit identification means to identify an erroneous bit of said data block comprising means to identify the bits of said data block correlated to said sum determined by said summing means and means to identify the bit of said bits correlated to said sum which is contained in a packet identified as having incorrect parity by said parity error identification means.

18. An apparatus as in claim 17 wherein the value of i is 8 such that said packets are each comprised of 8 bits and said Galois Field is the field represented as GF($2^7$) containing $2^7$ elements, each element capable of being represented by a 7-bit number.

19. An apparatus as in claim 18 wherein said error correction packet is the first packet of said data block received by said receiving means and said Galois Field element generating means and said summing means together include a 7-bit feedback shift register.

20. An apparatus as in claim 19 wherein said feedback shift register includes (i) means to add modulo 2 the output of the most significant bit of the register to the bit received by said receiving means and input the result of the additon to the least significant bit of the register; and (ii) means to add modulo 2 the output of the most significant bit of the register to the contents of the third least significant bit of the register and input the result to the fourth least significant bit of the register.

21. An apparatus as in claim 18 wherein said parity error identification means includes second storing means to store information identifying a packet having incorrect parity and said incorrect bit identification means includes:

(a) a 7-bit feedback shift register containing the representation of said sum of selected ones of said digital signals representative of Galois Field elements;

(b) cycling means to cycle said register repetitively as each bit of the stored data block is transmitted from said first storing means;

(c) packet identification means to identify the packet of a bit being transmitted from said first storing means;

(d) comparing means for comparing said packet identified by said packet identification means to said information stored by said second storing means and determining whether said packet was identified as having incorrect parity; and (e) bit correction means to change the bit transmitted from said first storing means when said register contains the representation of the last received bit and said comparing means determines that the packet containing said bit was identified as having incorrect parity.

22. The apparatus of claim 21 wherein said parity determining means includes:

(i) a counter to count from 1 to 8 repetitively at substantially the same rate at which data bits are received by said receiving means such that each count corresponds to a received bit and each count of 8 corresponds to a received packet; and, (ii) logic means to sum modulo 2 the bits of a packet the value of the sum determining the parity of said packet.

23. The apparatus of claim 18 or claim 22 further comprising decoding failure signalling means, said signalling means comprising:

(a) first signalling means to produce a correction failure signal if two or more of said packets received by said receiving means are identified by said parity error identification means as having incorrect parity;

(b) second signalling means to produce a correction failure signal when at least one of said packets is identified by said parity error identification means as having incorrect parity and said sum determined by said summing means is 0; and (c) third signalling means to produce a correction failure signal when an erroneous bit has not been identified by said incorrect bit identification means and said sum determined by said summing means is not 0.

24. An apparatus for decoding a data block comprising data packets and one error correction packet, each of said packets comprising a sequence of i bits whereby "i" is a positive integer and one of said i bits is a parity bit, to permit correction of a single bit error occurring in said data block, comprising:

(a) receiving and storing means for receiving and storing said data block comprising a sequence of packets, wherein each packet is of fixed parity;

(b) parity determining means to determine the parity of each of said packets;

(c) parity error identification means to identify at least one of said packets having incorrect parity;

(d) multiplication means to multiply one of said data packets by the element $\alpha^i$ of the Galois field GF($2^{i-1}$) said element being the ith power of the root $\alpha$ of a primitive polynomial of degree $i-1$, to form a partial product;

(e) summing means to add, modulo 2, one of said packets to said partial product to form a partial syndrome;

(f) multiplying means to multiply said partial syndrome by said Galois field element $\alpha^i$ to form a partial product;

(g) operating means to repetitively engage said summing and multiplying means until all of said packets have been added to said partial product to form a resultant syndrome;

(h) incorrect bit identification means to identify an incorrect bit occurring in said data block comprising;

(i) logarithm calculation means to calculate the logarithm to base $\alpha$ of said resultant syndrome said logarithm identifying the position of a suspect bit of said data block;

(ii) suspect packet identification means to determine the packet containing said suspect bit said packet being a suspect packet; and (iii) packet testing means to indicate whether said suspect packet is a packet identified by said parity error identification means as having incorrect parity comprising; and (i) bit correction means to change said suspect bit if said packet testing means has indicated that said suspect packet is a packet having incorrect parity.

25. The apparatus of claim 24 wherein the value of i is 8.

26. The apparatus of claim 24 wherein said multiplying means includes a microprocessor and memory accessible to said microprocessor wherein said microprocessor and said memory are configured such that said microprocessor is able to directly read said partial product from said memory.

27. The apparatus of claim 24 wherein said logarithm calculation means includes a microprocessor and memory accessible to said microprocessor wherein said microprocessor and said memory are configured such that said microprocessor is able to directly read said logarithm from said memory.

28. The apparatus of claim 24 wherein said summing means and said parity determining means includes a microprocessor and memory accessible to said microprocessor the bytes of said memory containing all possible values of said packets, each of said memory bytes having correct parity, whereby said partial syndrome can be calculated and said parity can be determined contemporaneously by adding the appropriate one of said memory bytes to said partial product.

29. A method of producing an error correction packet for transmission in a data block, said error correction packet having M bits, one of which M bits is a parity check bit, whereby, (i) said data block consists of said error correction packet and (L−1) data packets, each of said data packets having M bits and the same predetermined parity, one of said M bits of each of said (L−1) data packets being a parity check bit, whereby both "L" and "M" are positive integers;

(ii) the symbol $C_i$ represents the binary value of the ith bit in said data block such that the bit sequence $(C_0, C_1, C_2, \ldots C_N)$ represents the binary values of the sequence of bits in a data block of length (N+1) bits, whereby N+1=ML, "N" being a positive integer and "i" being an integer greater than or equal to 0 and less than or equal to N;

(iii) the bit sequence $(C_{jm}, C_{jM+1}, C_{jM+2}, \ldots C_{jM+(M-1)})$ represents the values of each of the M bits of said error correction packet being the (j+1)st packet of said data block, whereby j is a positive integer greater than or equal to 0 and less than or equal to (L−1); and, (iv) the symbol $\alpha$ represents a primitive element of a Galois Field $GF(2^{M-1})$, $\alpha$ being a root of a primitive polynomial Q(X) of degree (M−1), and where the arithmetic operation addition is performed according to modulo 2 arithmetic;

said method comprising the steps:

(a) evaluating the sum T having an expansion as a pattern of (M−1) bits, whereby $$T = \sum_{i=0}^{jM-1} C_i \alpha^i + \sum_{i=jM+M}^{N} C_i \alpha^i,$$

if j is not equal to 0 or (L−1) or, $$T = \sum_{i=M}^{N} C_i \alpha^i,$$

if j is equal to 0, or, $$T = \sum_{i=0}^{(L-1)M-1} C_i \alpha^i,$$

if j is equal to L−1; and, producing a sequence of bits $(C_{jM}, C_{jM+1}, \ldots C_{jM+(M-1)})$ such that:

(i) said sequence of bits satisfies the relationship expressed as:

$$\sum_{i=jM}^{jM+(M-1)} C_i \alpha^i = T,$$

whereby T is the sum of said evaluation; and, (ii) said sequence of bits has the same predetermined parity as that of each of said data packets of said data block.

30. A method of decoding a received data block, said data block comprising (L−1) data packets and one error correction packet, each of said packets consisting of M bits, said data block having been previously encoded such that (i) each packet of said data block was produced having the same predetermined parity; and (ii) said error correction packet was produced such that the value of the sum represented by $$\sum_{i=0}^{N} C_i \alpha^i$$

equaled zero, wherein the symbol $C_i$ represents the binary value of the ith bit is said previously encoded data block and the bit sequence $(C_0, C_1, C_2, \ldots C_N)$ represents the binary values of the sequence of bits comprising said encoded data block of length (N+1) bits, whereby N+1=ML, "N", "L" and "M" are positive integers, "i" is an integer greater than or equal to 0 and less than or equal to N, and the symbol $\alpha$ represents a primitive element of the Galois Field $GF(2^{M-1})$, $\alpha$ being a root of a primitive polynomial Q(X) od degree (M−1);

said method comprising the steps:

(a) identifying any one of said received packets not having said predetermined parity;

(b) evaluating the sum R whereby $$R = \sum_{i=0}^{N} r_i \alpha^i,$$

wherein the symbol $r_i$ represents the binary value of the ith bit of said received data block such that the bit sequence $(r_0, r_1, r_2, \ldots r_N)$ represents the binary values of the received sequence of bits of said data block; and (c) correcting an incorrect bit in said received data block including identifying and changing bit $r_g$ in the (k+1)st packet of said received data block whereby the value g is determined from said sum R according to the relationship $R = \alpha^g$ such that $MK \leq g \leq (MK + M - 1)$, K being an integer greater than or equal to 0 and less than or equal to (L−1), the (K+1)st packet having been identified as having other than said predetermined parity.

* * * * *

UNITED STATES PATENT AND TRADEMARK OFFICE
CERTIFICATE OF CORRECTION

PATENT NO. : 4,599,722                    Page 1 of 5

DATED     : 8 July, 1986

INVENTOR(S) :  Mortimer

It is certified that error appears in the above-identified patent and that said Letters Patent is hereby corrected as shown below:

On the cover page, delete the written matter below the printed table.

In column 3, at line 60, following "$C_{jM+1}, \ldots$" insert --$C_{jM+(M-1)}$) satisfying--.

In column 7, at line 18, delete "= $(\alpha^3 + 1)\alpha^6$" and insert therefor --= $(\alpha^3 + 1)\alpha^5$--.

In column 9, at line 36, following "the bits" insert --are--.

In column 9, at line 43, "1." should be positioned at the left hand margin.

In column 10, at line 27, "(1)" should be positioned at the left hand margin.

UNITED STATES PATENT AND TRADEMARK OFFICE
CERTIFICATE OF CORRECTION

PATENT NO. : 4,599,722  Page 2 of 5
DATED : 8 July, 1986
INVENTOR(S) : Mortimer

It is certified that error appears in the above-identified patent and that said Letters Patent is hereby corrected as shown below:

In column 10, at line 39, delete "far" and insert therefor --for--.

In column 10, at line 60, delete "as" and insert therefor --is--.

In column 10, at line 62, "(1)" should be positioned at the left hand margin.

In column 11, at line 16, following "$C_0$" insert --to--.

In column 12, delete lines 17 to 22 inclusive.

In column 13, at line 20, delete "connected" and insert therefor --corrected--.

In column 13, at line 52, delete "correctin" and insert therefor --correction--.

UNITED STATES PATENT AND TRADEMARK OFFICE
CERTIFICATE OF CORRECTION

PATENT NO. : 4,599,722

DATED : 8 July, 1986

INVENTOR(S) : Mortimer

It is certified that error appears in the above-identified patent and that said Letters Patent is hereby corrected as shown below:

In column 15, at line 1, following "8th" insert --bit--.

In column 15, at line 57, delete "$C_{223}\alpha^8$" and insert therefor --$C_{222}\alpha^8$--.

In column 16, at line 62, following "data" insert --bits--.

In column 17, at line 38, delete "register" and insert therefor --registers--.

In column 17, at line 65, following "A "1"" insert --is added to registers 310 and 316 if the received bit, $C_i$, is a "1"--.

In column 17, at line 67, delete "ter" and insert therefor --ters--.

UNITED STATES PATENT AND TRADEMARK OFFICE
CERTIFICATE OF CORRECTION

PATENT NO. : 4,599,722  
DATED : 8 July, 1986  
INVENTOR(S) : Mortimer

Page 4 of 5

It is certified that error appears in the above-identified patent and that said Letters Patent is hereby corrected as shown below:

In column 23, at line 48, delete "registrs" and insert therefor --registers--.

In column 24, at line 30, delete "has" and insert therefor --had--.

In column 25, at line 13, delete "has" and insert therefor --had--.

In column 25, at line 31, delete "resultiong" and insert therefor --resulting--.

In column 25, at line 67, delete "$\overline{+}$" and insert therefor --"--.

In column 26, at line 25, delete "th" and insert therefor --the--.

In column 26, at line 26, delete "$B_i 60^8 + B_{i+1}$" and insert therefor --$B_i \alpha^8 + B_{i+1}$--.

UNITED STATES PATENT AND TRADEMARK OFFICE
CERTIFICATE OF CORRECTION

PATENT NO. : 4,599,722
DATED : 8 July, 1986
INVENTOR(S) : Mortimer

It is certified that error appears in the above-identified patent and that said Letters Patent is hereby corrected as shown below:

In column 27, at line 41, delete "N+1+ML" and insert therefor --N+1=ML--.

In column 28, at line 19, delete "$C_{jM+(M-)}$" and insert therefor --$C_{jM+(M-1)}$--.

In column 28, at line 26, following "$X^7$" insert --+--.

In column 36, at line 17, before "producing" insert --(b)--.

In column 36, at line 54, delete "od" and insert therefor --of--.

Signed and Sealed this

Thirtieth Day of December, 1986

Attest:

DONALD J. QUIGG

Attesting Officer    Commissioner of Patents and Trademarks